United States Patent [19]

Hayashi et al.

[11] Patent Number: 5,717,251

[45] Date of Patent: Feb. 10, 1998

[54] SEMICONDUCTOR INTEGRATED CIRCUIT DEVICE HAVING MINATURE MULTI-LEVEL WIRING STRUCTURE LOW IN PARASITIC CAPACITANCE

[75] Inventors: Yoshihiro Hayashi; Takahiro Onodera, both of Tokyo, Japan

[73] Assignee: NEC Corporation, Japan

[21] Appl. No.: 689,088

[22] Filed: Aug. 5, 1996

[30] Foreign Application Priority Data

Aug. 10, 1995 [JP] Japan .................. 7-224539

[51] Int. Cl.[6] ............. H01L 23/48; H01L 23/52
[52] U.S. Cl. ............. 257/758; 257/386; 257/752; 257/759; 257/774
[58] Field of Search ............. 257/386, 749, 257/750, 752, 758, 759, 774

[56] References Cited

U.S. PATENT DOCUMENTS

| | | | |
|---|---|---|---|
| 4,970,574 | 11/1990 | Tsunenari | 357/71 |
| 5,173,442 | 12/1992 | Carey | 437/173 |
| 5,404,046 | 4/1995 | Matsumoto et al. | 257/752 |
| 5,451,804 | 9/1995 | Lur et al. | 257/759 |
| 5,471,093 | 11/1995 | Cheung | 257/752 |
| 5,550,405 | 8/1996 | Cheung et al. | 257/759 |
| 5,616,959 | 4/1997 | Jeng | 257/759 |
| 5,625,232 | 4/1997 | Numata et al. | 257/752 |
| 5,629,557 | 5/1997 | Yamaha | 257/759 |
| 5,661,344 | 8/1997 | Havemann et al. | 257/759 |

FOREIGN PATENT DOCUMENTS 2-235359  9/1990  Japan ............. H01L 21/90

OTHER PUBLICATIONS

"Dual Damascene: A Ulsi Wiring Technology"; Kaanta et al IEEE 1991, VMIC Conference, Jun. 11–12, pp. 144–153.

*Primary Examiner*—Tom Thomas
*Assistant Examiner*—David Ostrowski
*Attorney, Agent, or Firm*—Hayes, Soloway, Hennessey, Grossman & Hage, P.C.

[57] ABSTRACT

After a pattern transfer of a first pattern image to a lower photo-sensitive layer of first material, a second pattern image is transferred to an upper photo-sensitive layer of second material higher in photo-sensitivity than the first material, and the first image and the second image are concurrently developed so as to form a composite etching mask through a simple process.

8 Claims, 19 Drawing Sheets

SEMICONDUCTOR INTEGRATED CIRCUIT DEVICE HAVING MINATURE MULTI-LEVEL WIRING STRUCTURE LOW IN PARASITIC CAPACITANCE

FIELD OF THE INVENTION

This invention relates to a semiconductor device and a process of fabrication thereof and, more particularly, to a wiring structure incorporated in a semiconductor integrated circuit device and a process of fabrication thereof.

DESCRIPTION OF THE RELATED ART

A large-scale integration contains a large number of circuit components such as field effect transistors, and the circuit components are connected through wirings. The large-scale integration usually contains a plurality of circuit blocks, and the circuit components form the circuit blocks. Accordingly, the wirings are broken down into two categories. The wirings of the first category are called as local wirings, and the wirings of the second category are hereinbelow referred to as global wirings. The circuit components are connected through the local wirings, and form the circuit blocks. On the other hand, the circuit blocks are connected through the global wirings so as to form the large-scale integration.

The circuit block is assigned real estate as narrow as possible, and, accordingly, the local wirings are arranged as close as possible. For this reason, one of the technical problems is to decrease the wiring pitch. On the other hand, the wiring pitch is less serious for the global wirings. The most series technical problem in the global wirings is to accelerate the signal propagation. A large scale integration requires a large semiconductor chip, and the circuit blocks tend to be spaced from one another. The global wirings are expected to propagate signals between the circuit blocks widely spaced, and tend to be prolonged. The complexity of wiring arrangement further increases the signal propagation path, and the parasitic capacitance is increased together with the signal propagation path. While a signal is being propagated along the long signal propagation path, an inter-level coupling noise and the large time constant coupled to the global wiring affect the waveform of the signal, and retards the signal propagation. In order to shrink the signal propagation path, a multi-level structure is employed in the global Wirings, and the manufacturer tries to decrease the dielectric constant of an inter-level insulating layer of the multi-level structure.

FIGS. 1A to 1D illustrate a typical example of the prior art process sequence for fabricating a multi-level wiring structure. First, lower aluminum wirings 1a, 1b and 1c are patterned on a lower inter-level insulating layer 2 of silicon oxide grown on a major surface of a semiconductor substrate 3. An inter-level insulating layer 4 of silicon oxide is deposited over the lower aluminum wirings 1a to 1c by using a chemical vapor deposition. The inter-level insulating layer 4 is polished by using a chemical mechanical polishing technique, and a smooth top surface is created.

A photo-resist etching mask 5 is provided on the inter-level insulating layer 4 by using photo-lithographic techniques. In detail, photo-resist solution is spread over the entire top surface of the inter-level insulating layer 4, and a pattern image for through-holes is optically transferred to the photo-resist layer. When the photo-resist layer is developed, holes 5a are formed in the photo-resist layer 5, and the photo-resist etching mask is provided on the inter-level insulating layer 4.

The photo-resist etching mask 5 partially exposes the inter-level insulating layer 4 to dry etching gas mainly composed of tetrafluoride ($CF_4$), and the dry etching gas forms vertical through-holes 4a and 4b in the inter-level insulating layer 4. The vertical through-holes 4a and 4b reach the upper surfaces of the lower aluminum wirings 1b and 1c, respectively, as shown in FIG. 1A.

Subsequently, the photo-resist etching mask 5 is exposed to oxygen plasma gas, and the oxygen plasma gas ashes the photo-resist etching mask 5 so as to remove it from the resultant structure.

Titanium and titanium nitride are successively deposited over the entire surface of the resultant structure to 100 angstroms and 500 angstroms, respectively, and the titanium film and the titanium nitride layer form a first barrier layer (not shown). The first barrier layer topographically extends over the exposed surface of the structure, and covers the surfaces defining the vertical through-holes 4a and 4b. Tungsten is deposited over the first barrier layer by using a chemical vapor deposition, and a blanket tungsten layer topographically extends on the first barrier layer. A tungsten layer 6 not only fills the vertical through-holes 4a and 4b but also covers the upper surface of the inter-level insulating layer 4 a shown in FIG. 1B.

The tungsten layer 6 is uniformly etched without an etching mask until the upper surface of the inter-level insulating layer 4 is exposed, again. As a result, tungsten plugs 6a and 6b are left in the vertical through-holes 4a and 4b, respectively.

Titanium and titanium nitride are successively deposited over the entire surface of the resultant structure to 100 angstroms and 500 angstroms, respectively, and form a second barrier layer (not shown) covering the upper surface of the inter-level insulating layer 4 and the upper surfaces of the tungsten plugs 6a and 6b. Aluminum is deposited over the second barrier layer, and the aluminum layer and the second barrier layer form a composite conductive layer 7.

Photo-resist solution is spread over the entire surface of the composite conductive layer 7, and a pattern image for upper wirings is optically transferred to the photo-resist layer. When the photo-resist layer is developed, the photo-resist is partially removed, and a photo-resist etching mask 8 is provided on the composite conductive layer 7 as shown in FIG. 1C.

The photo-resist etching mask 8 exposes the composite conductive layer 7 to chlorine-containing etching gas, and upper wirings 7a, 7b and 7c are patterned from the composite conductive layer 7. The upper wirings 7b and 7c are held in contact with the upper surfaces of the tungsten plugs 6a and 6b, respectively, and are electrically connected through the tungsten plugs 6a and 6b to the lower aluminum wirings 1b and 1c, respectively. Finally, the photo-resist etching mask is exposed to oxygen plasma gas, and the oxygen plasma gas ashes the photo-resist mask 8 so as to remove it from the structure. The resultant structure is illustrated in FIG. 1D.

The prior art process shown in FIGS. 1A to 1D is so complex that Kaanta et. al. propose a process sequence for fabricating a multi-level wiring structure in IEEE 1991 VMIC Conference, June 11–12, pages 144 to 153. Kaanta et. al. concurrently form upper wirings and vertical through-holes so as to decrease the steps of process. The prior art process proposed by Kaanta et. al. is hereinbelow described with reference to FIGS. 2A to 2H.

The prior art process starts with preparation of a semiconductor substrate 10. A lower insulating layer 11 of silicon oxide is formed over the semiconductor substrate 10, and lower wirings 12a and 12b are formed in grooves 11a and 11b of the lower insulating layer 11. The lower insulating layer 11 and the lower wirings 12a/12b are overlain by an inter-level insulating layer 13 of silicon oxide, and a photo-resist etching mask 14 is provided on the inter-level insulating layer 13 through an optical pattern transfer and a development of photo-resist layer as shown in FIG. 2A. The photo-resist etching mask 14 has a pattern 14a for a vertical through-hole.

Subsequently, photo-resist solution is spread over the photo-resist etching mask 14, and a pattern image for the vertical through-hole and an upper wiring is optically transferred to the photo-resist layer. The photo-resist layer is developed, and a photo-resist etching mask 15 is formed from the photo-resist layer. The photo-resist etching mask 15 has a first pattern for the upper wiring and a second pattern 15b aligned with the pattern 14a. The photo-resist etching masks 14 and 15 form a composite etching mask structure 16, and the inter-level insulating layer 13 is partially exposed to the patterns 14a and 15b. The resultant structure is illustrated in FIG. 2B.

The composite etching mask structure 15 exposes a part of the inter-level insulating layer 13 to chlorine-containing etching gas, and a recess 13a is formed in the inter-level insulating layer 13 as shown in FIG. 2C. Note the dry etching should be terminated at an appropriate depth, and the recess 13a does not reach the lower wiring 12b.

The etching gas is changed to oxygen plasma gas, and the oxygen plasma gas ashes the photo-resist etching mask 15. While the oxygen plasma gas is ashing the photo-resist etching mask 15, a part of the photo-resist etching mask 14 exposed to the first pattern 15a is also ashed by the oxygen plasma gas, and the first pattern 15a is transferred to the photo-resist etching mask 14. Thus, the photo-resist etching mask 14' has a pattern 14b for the upper wiring as well as the pattern 14a for the vertical through-hole as shown in FIG. 2D.

The oxygen plasma gas is replaced with the chlorine-containing etching gas, again, and the inter-level insulating layer 13 is partially etched away by using the photo-resist mask 14. The recess 13a increases the depth, and reaches the lower wiring 12b. The recess 13a deeply penetrates the inter-level insulating layer 13, and a through-hole 13b is formed under the pattern 14a. On the other hand, a groove 13c is formed under the pattern 14b. Thus, both of the through-hole 13b and the groove 13c are concurrently completed through the etching using the photo-resist etching mask 14'. The resultant structure is illustrated in FIG. 2E.

The photo-resist etching mask 14' is exposed to oxygen plasma gas, and is ashed in the oxygen plasma gas. As a result, the photo-resist etching mask 14' is removed as shown in FIG. 2F.

Appropriate metal such as aluminum is deposited over the resultant structure shown in FIG. 2F by using an evaporation or a sputtering. The metal fills the vertical through-hole 13b and the groove 13c, and swells into a metal layer 15 as shown in FIG. 2G.

The metal layer 15 is chemically mechanically polished until the inter-level insulating layer 13 is exposed, again. As a result, an upper wiring 15a and a vertical inter-level connection 15b are respectively left in the groove 13a and the vertical through-hole 13b as shown in FIG. 2H. Thus, Kaanta's process concurrently form the upper wiring 15a and the inter-level connection, and is, accordingly, simpler than the standard prior art process.

Another technical goal, i.e., reduction of a parasitic capacitance is achieved by using insulating material with a small dielectric constant. Silicon oxide deposited by using a plasma chemical vapor deposition usually forms the inter-level insulating layer, and the dielectric constant of the silicon oxide ranges from 3.9 to 4.5. It is known that fluorine added to the silicon oxide decreases the dielectric constant to 3.1. However, it is difficult to decrease the dielectric constant of inorganic material to 3.0 or less. For this reason, attention is focused on organic materials such as polyimide. The dielectric constant of polyimide ranges from 2.5 to 3.5, and the organic inter-level insulating layer is expected to drastically decrease the parasitic capacitance coupled between a lower wiring and an upper wiring.

Japanese Patent Publication of Unexamined Application No. 2-235359 discloses a typical example of the process for fabricating a multi-level wiring structure having an organic inter-level insulating layer, and FIGS. 3A to 3F illustrate the prior art process sequence.

First, a lower insulating layer 21 is formed on a semiconductor substrate 22, and aluminum wirings 23a, 23b and 23c are patterned from an aluminum layer deposited on the lower insulating layer 21. Silicon oxide is deposited over the entire surface of the structure, and the aluminum wirings 23a to 23c are covered with a silicon oxide layer 24.

Subsequently, polyimide is spun onto the silicon oxide layer 24, and the silicon oxide layer 24 is covered with a polyimide layer 25. The silicon oxide layer 24 and the polyimide layer 25 form in combination an inter-level insulating structure 26. The resultant structure is illustrated in FIG. 3A.

Photo-resist solution is spread over the polyimide layer 25, and a pattern image for through-holes is optically transferred to the photo-resist layer. The photo-resist layer is developed, and a photo-resist etching mask 27 is formed from the photo-resist layer as shown in FIG. 3B.

A dry etching system generates oxygen plasma from oxygen, and the photo-resist etching mask 27 exposes parts of the polyimide layer 25 to the oxygen plasma. The oxygen plasma ashes the exposed portions of the polyimide layer 25; however, the oxygen plasma does not etch the silicon oxide, and holes 25a and 25b are formed in the polyimide layer 25. The resultant structure is illustrated in FIG. 3C.

While the holes 25a and 25b are being formed in the polyimide layer 25, the oxygen plasma ashes the photo-resist etching mask 27, and the photo-resist etching mask 25 is automatically removed.

The dry etching gas is changed from the oxygen gas to tetrafluoride gas ($CF_4$), and the tetrafluoride gas selectively etches the silicon oxide layer 24 exposed to the holes 25a and 25b. As a result, vertical through-holes 28a and 28b are formed in the inter-level insulating structure 26, and the lower aluminum wirings 23b and 23c are exposed to the vertical through-holes 28a and 28b, respectively, as shown in FIG. 3D.

Aluminum is deposited over the entire surface of the structure. The aluminum fills the vertical through-holes 28a and 28b, and swells into an aluminum layer on the polyimide layer 25.

Photo-resist solution is spun onto the aluminum layer, and a pattern image for upper wirings is optically transferred to the photo-resist layer. The photo-resist layer is developed, and a photo-resist etching mask 29 is formed from the photo-resist layer.

The photo-resist etching mask 29 selectively exposes the aluminum layer to chlorine gas ($Cl_2$), and the aluminum layer is patterned into upper aluminum wirings 30a, 30b and 30c. The upper aluminum wirings 30b and 30c pass through the vertical through-holes 28a and 28b, and are held in contact with the lower aluminum wirings 23b and 23c, respectively. The resultant structure is illustrated in FIG. 3E.

Finally, the photo-resist etching mask 29 is exposed to oxygen plasma, and is ashed away. The resultant multi-level wiring structure is illustrated in FIG. 3F.

The prior art process sequences shown in FIGS. 1A to 1D, FIGS. 2A to 2H and FIGS. 3A to 3F are hereinbelow referred to as "first prior art process", "second prior art process" and "third prior art process", respectively.

A problem inherent in the first prior art process is the complexity of the process sequence. The first prior art process incorporates two lithographic processes for the pattern image for the vertical through-holes and the pattern image for the upper wirings, two metal growing steps for the tungsten and the aluminum, two dry etching steps for the vertical through-holes and the upper wirings and a single chemical mechanical polishing. Thus, the multi-level wiring structure is fabricated through a large number of steps, and, accordingly, the first prior art process increases the production cost of the semiconductor device.

Another problem inherent in the first prior art process is large parasitic capacitance coupled between the lower wiring 1a and the upper wiring 7a due to the inorganic material for the inter-level insulating layer 4. Therefore, the first prior art process is not suitable for forming global wirings between circuit blocks.

The second prior art process requires only one metal growing step, and, accordingly, is less in process steps than the first prior art process. However, the second prior art process encounters a problem in the pattern transfer to the photo-resist layer on the photo-resist etching mask 14.

As described hereinbefore, the second prior art process requires the composite etching mask structure 16, and the lithographic step is twice repeated for the composite etching mask structure 16. The photo-resist layer is spread over the lower photo-resist etching mask 14 already patterned, and not only the first pattern 15a for the wiring groove but also the second pattern 15b for the through-hole are formed in the photo-resist layer through the optical pattern transfer and the development. However, the pattern 14a creates a step in the photo-resist etching mask 14, and the upper photo-resist layer tends to locally increase the thickness. The thicker a photo-resist layer is, the more the exposure light is. For this reason, the upper photo-resist layer is exposed to a large amount of light. However, the light is too much to exactly transfer the first pattern 15a to the upper photo-resist layer, and the first pattern 15a is liable to be widened. Especially, if grooves are close together, adjacent two grooves tend to be integrated together. Thus, the first problem inherent in the second prior art process is faithless pattern transfer to the upper photo-resist layer.

Another problem inherent in the second prior art process is the complicated dry etching process. After the completion of the composite etching mask structure 16, the chlorine-containing etching gas is introduced so as to form the recess 13a in the inter-level insulating layer 13, and, thereafter, the etching gas is changed from the chlorine-containing gas to the oxygen as so as to transfer the first pattern 15a from the photo-resist etching mask 15 to the photo-resist etching mask 14. After the pattern transfer from the photo-resist etching mask 15 to the photo-resist etching mask 14, the etching gas is changed from the oxygen to the chlorine-containing gas so as to form the groove 13c and the vertical through-hole 13b in the inter-level insulating layer 13. The etching gas is changed from the chlorine-containing gas to the oxygen, again, and the photo-resist etching mask 14' is ashed in the oxygen plasma. Thus, the etching gas is frequently changed, and makes the dry etching process complicated.

Yet another problem inherent in the second prior art process is similar to the second problem of the first prior art process, and is large parasitic capacitance coupled between the lower wiring 11a and the upper wiring 15a due to the inorganic material for the inter-level insulating layer 13. Therefore, the second prior art process is also not suitable for long-distance wirings or global wirings.

The third prior art process achieves the wiring structure decreased in parasitic capacitance by virtue of the inter-level organic insulating layer 25. However, the third prior art process encounters a problem in low reliability of the wiring structure.

In detail, the third prior art process achieves the composite inter-level insulating structure 26 consisting of the silicon oxide layer 24 and the polyimide layer 25. After the pattern patterning for the upper wirings 30a to 30c, the photo-resist etching mask 29 is ashed in oxygen plasma. However, the oxygen plasma also ashes the polyimide layer 25, and the polyimide layer 25 is partially decreased in thickness as shown in FIG. 3F. The upper wirings 30a to 30c are unstably supported by the polyimide layer 25, and are liable to be disconnected. For this reason, the multi-level wiring structure fabricated through the third prior art process is less reliable.

SUMMARY OF THE INVENTION

It is therefore an important object of the present invention to provide a semiconductor integrated circuit device a multi-level wiring structure of which is reliable and low in parasitic capacitance.

It is also an important object of the present invention to provide a process of fabricating a semiconductor integrated circuit device which is simple and capable of forming an extremely narrow wiring.

In accordance with one aspect of the present invention, there is provided a semiconductor integrated circuit device comprising: at least one circuit component; a multi-level wiring structure coupled to the at least one circuit component for forming an integrated circuit, and including at least one lower wiring, a lower inter-level insulating layer formed of first photo-sensitive organic material and over the at least one lower wiring and having a hole, the at least one lower wiring being exposed to the hole, an upper inter-level insulating layer formed of second photo-sensitive organic material higher in photo-sensitivity than the first photo-sensitive organic material and having a plurality of grooves, one of the plurality of grooves being connected to the hole, an interconnection formed in the hole and held in contact with the at least one lower wiring, and a plurality of upper wirings formed in the plurality of grooves, an upper wiring formed in the one of the plurality of grooves being held in contact with the interconnection.

In accordance with another aspect of the present invention, there is provided a semiconductor integrated circuit device comprising: a plurality of circuit blocks each having a plurality of circuit components; and a multi-level wiring structure coupled to the at least one circuit component for forming an integrated circuit, and including at least one lower wiring embedded in an inorganic inter-level insulating layer for interconnecting two of the plurality of circuit components of one of the plurality of circuit blocks and form a flat upper surface together with the inorganic inter-level insulating layer, an organic inter-level insulating layer formed on the inorganic inter-level insulating layer and having a groove open to an upper surface thereof and a through-hole open at a lower end thereof to the at least one lower wiring, an interconnection formed in the through-hole, held in contact with the at least one lower wiring and open at an upper end thereof to the groove, and at least one upper wiring formed in the groove and held in contact with the interconnection for interconnecting the one of the plurality of circuit blocks and another of the plurality of circuit blocks.

In accordance with yet another aspect of the present invention, there is provided a process of fabricating a semiconductor integrated circuit device, comprising the steps of: a) preparing a substrate; b) forming at least one lower wiring over the substrate; c) forming a first photo-sensitive layer formed of first photo-sensitive material and over the substrate; d) optically transferring a first pattern to the first photo-sensitive layer so as to form a first latent image therein; e) forming a second photo-sensitive layer formed of second photo-sensitive material higher in photo-sensitivity than the first photo-sensitive material and on the first photo-sensitive layer; f) optically transferring a second pattern to the second photo-sensitive layer so as to form a second latent image therein without a substantial optical influence on the first photo-sensitive layer; g) concurrently developing the first latent image and second latent image so as to form a patterned structure; and h) forming a multi-level wiring structure by using the patterned structure, the multi-level wiring structure including the at least one lower wiring, an inter-level insulating layer, at least one interconnection held in contact with the at least one lower wiring and having a configuration corresponding to the first latent image and a plurality of upper wirings having respective configurations corresponding to the second latent image, one of the plurality of upper wirings being held in contact with the interconnection.

BRIEF DESCRIPTION OF THE DRAWINGS

The features and advantages the semiconductor integrated circuit device and the process of fabrication thereof according to the present invention will be more clearly understood from the following description taken in conjunction with the accompanying drawings in which.

PRINCIPLE OF PATTERN TRANSFER

Figure 1A:
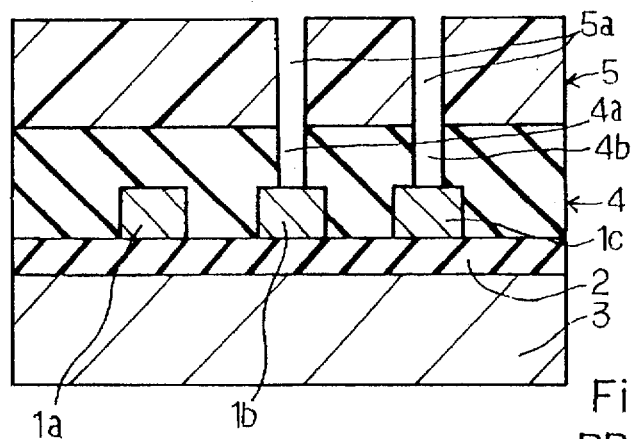
FIGS. 1A to 1D are cross sectional views showing the process sequence of the standard prior art process.
Figure 1B:
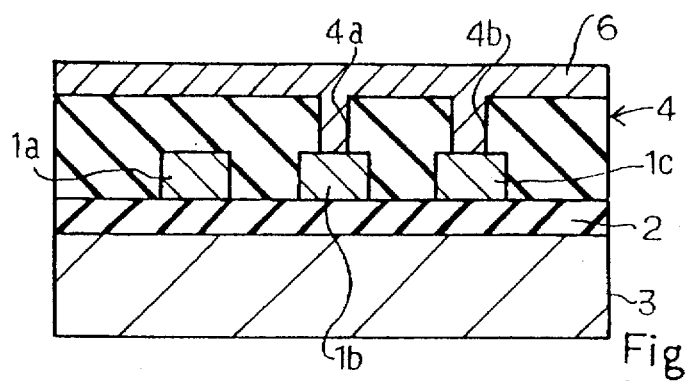
Figure 1C:
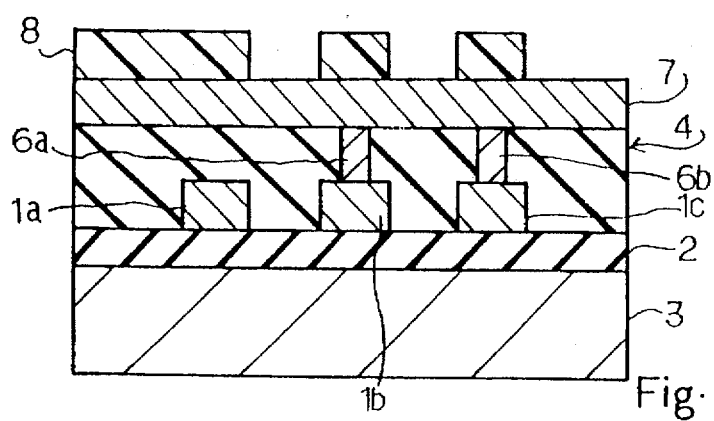
Figure 1D:
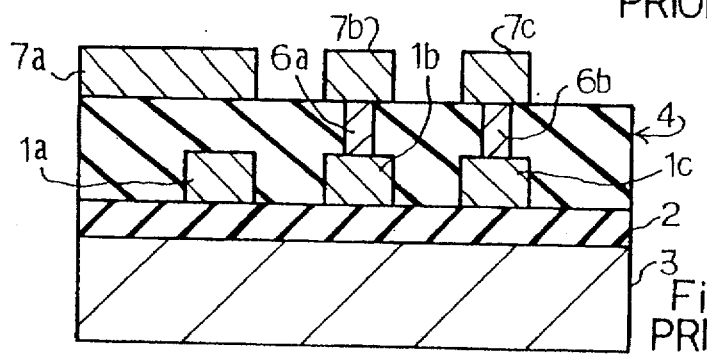
Figure 2A:
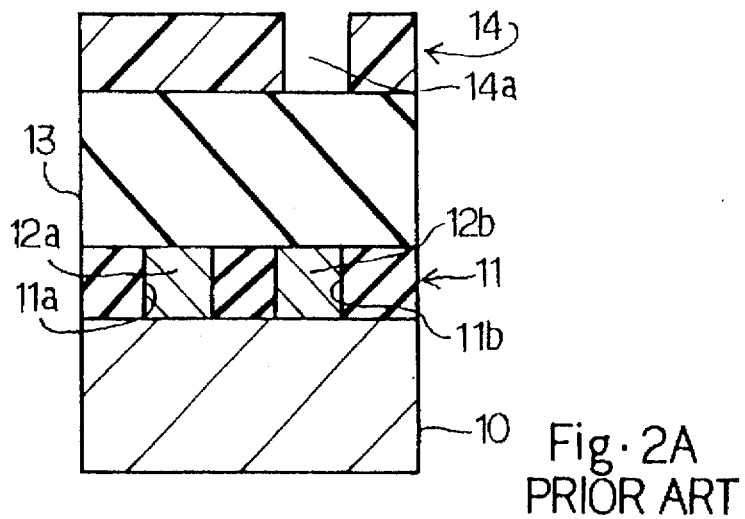
FIGS. 2A to 2H are cross sectional views showing the process sequence proposed by C. W. Kaanta et. al.
Figure 2B:
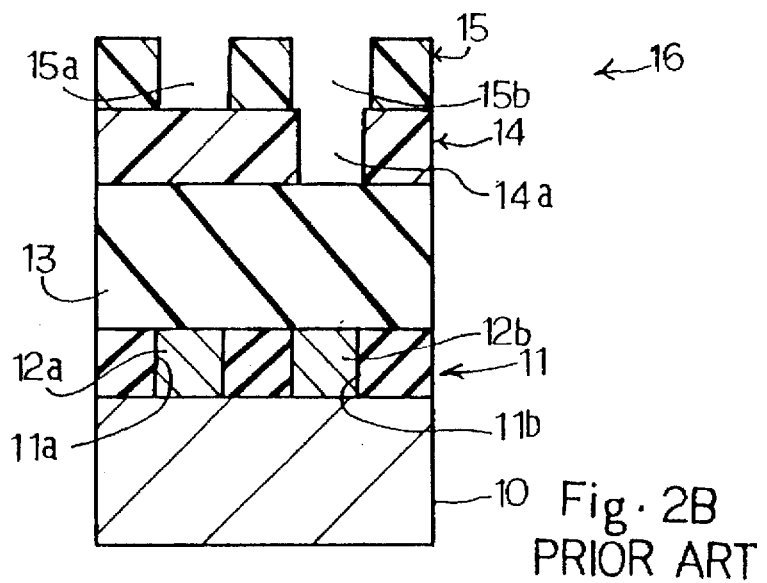
Figure 2C:
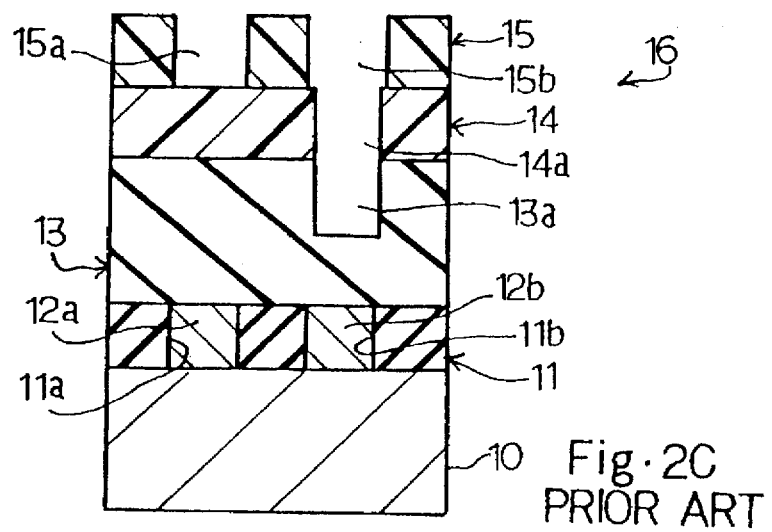
Figure 2D:
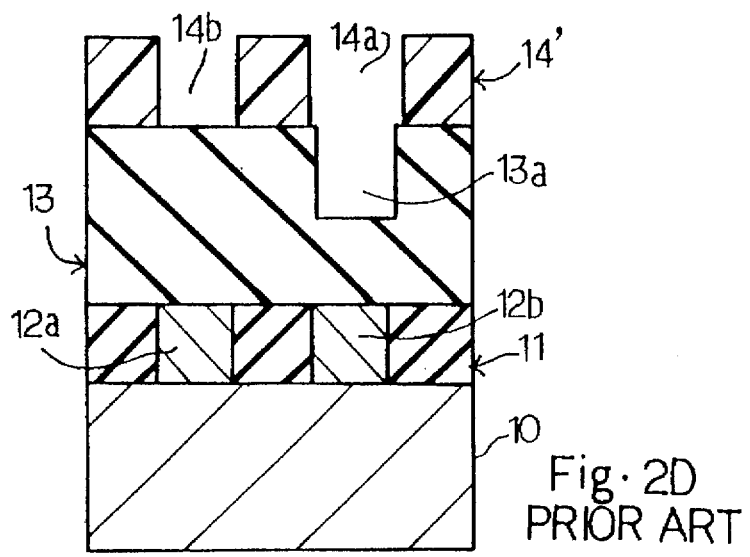
Figure 2E:
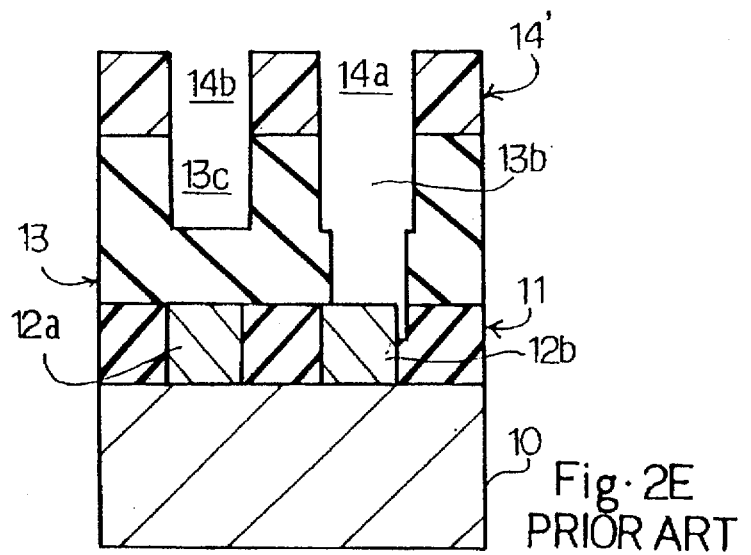
Figure 2F:
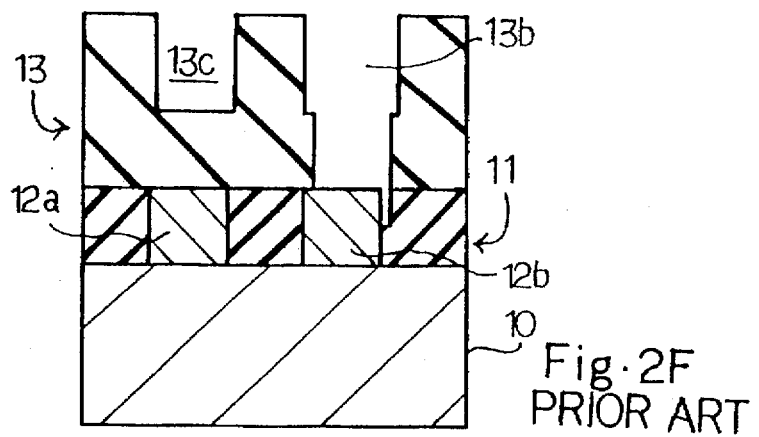
Figure 2G:
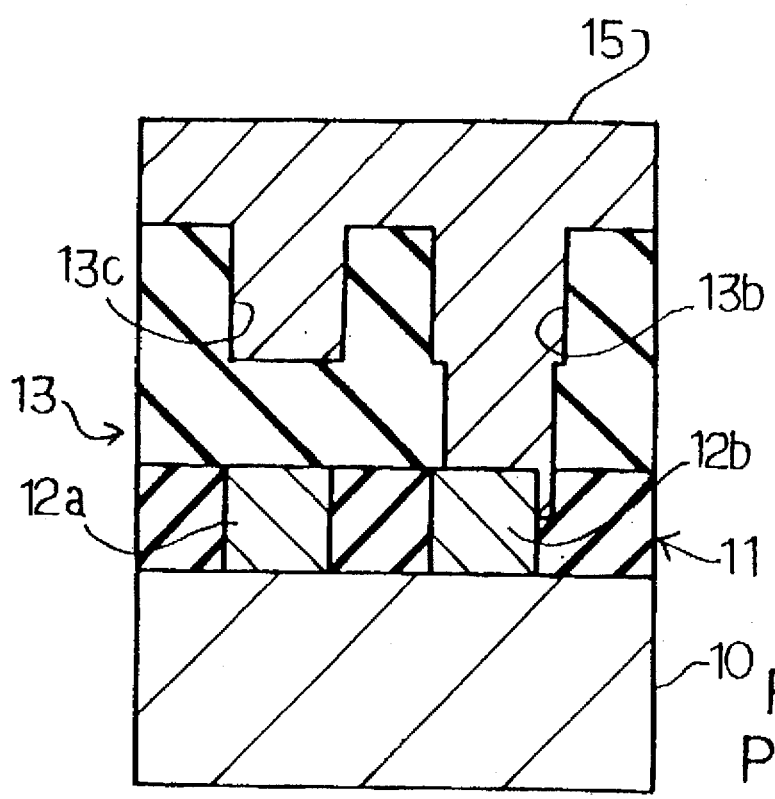
Figure 2H:
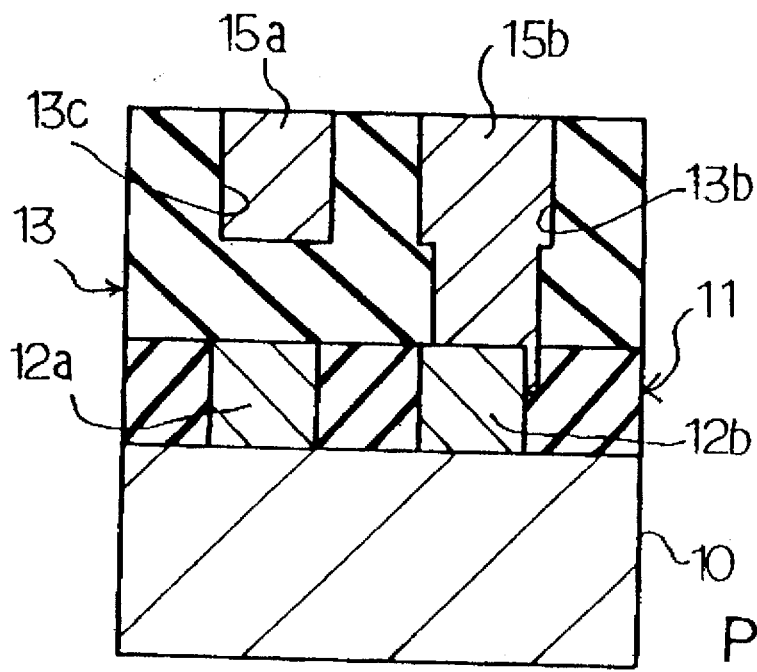
Figure 3A:
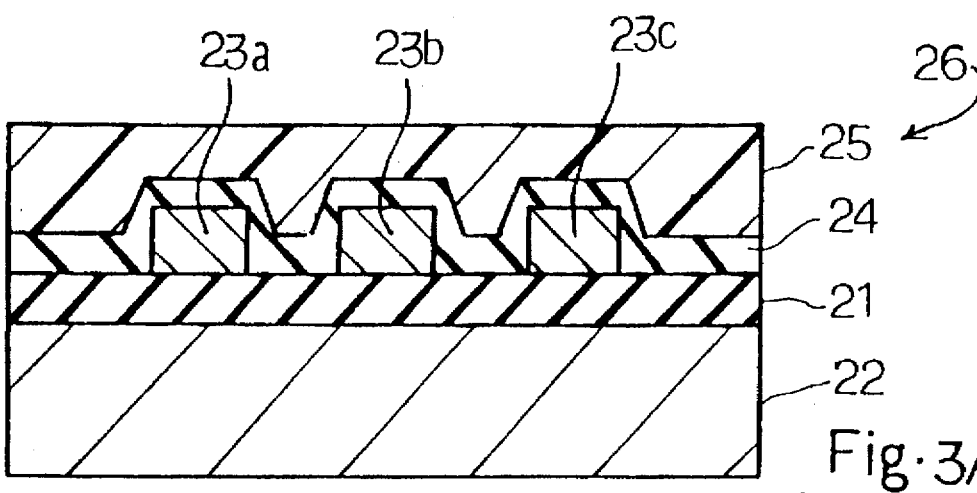
FIGS. 3A to 3F are cross sectional views showing the process sequence disclosed in Japanese Patent Publication of Unexamined Application No. 2-235359.
Figure 3B:
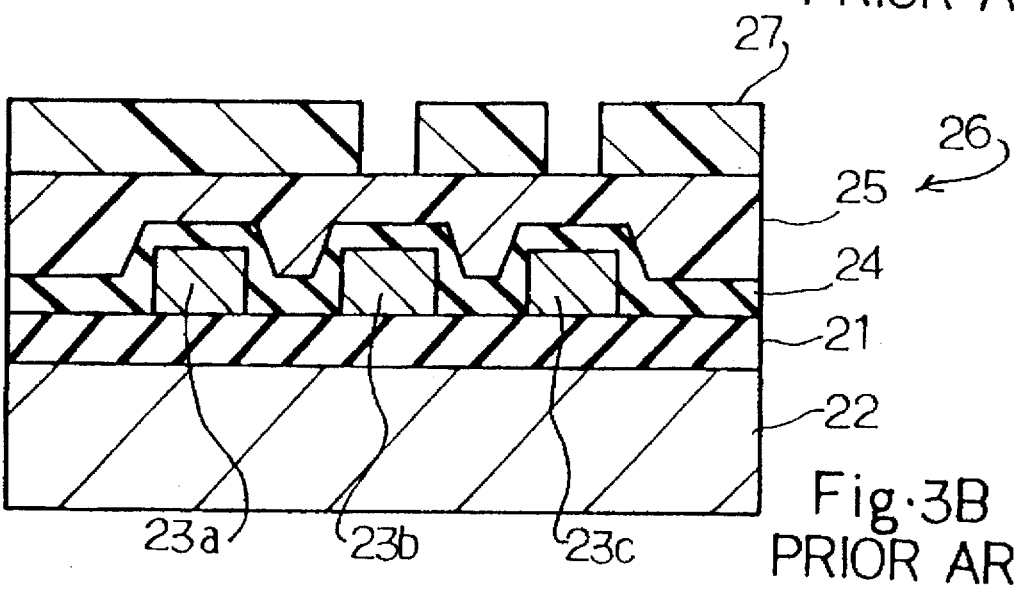
Figure 3C:
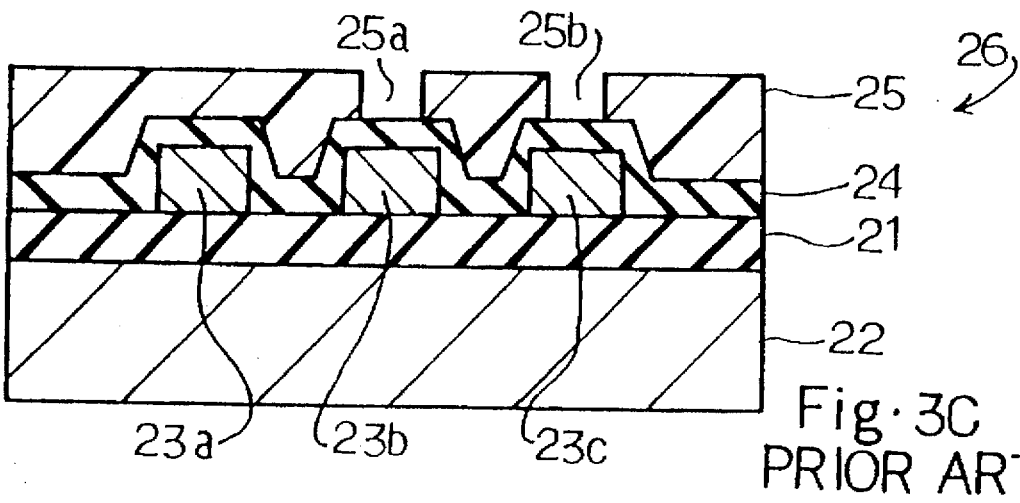
Figure 3D:
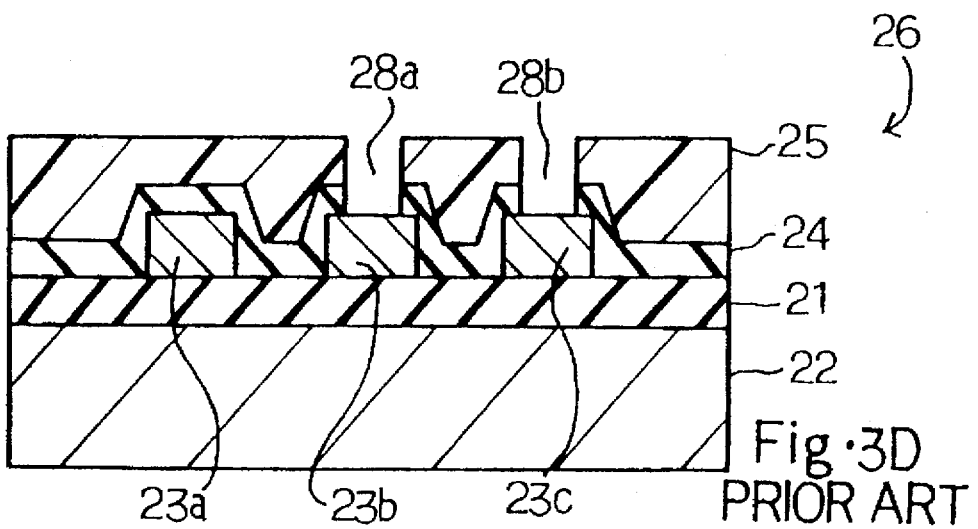
Figure 3E:
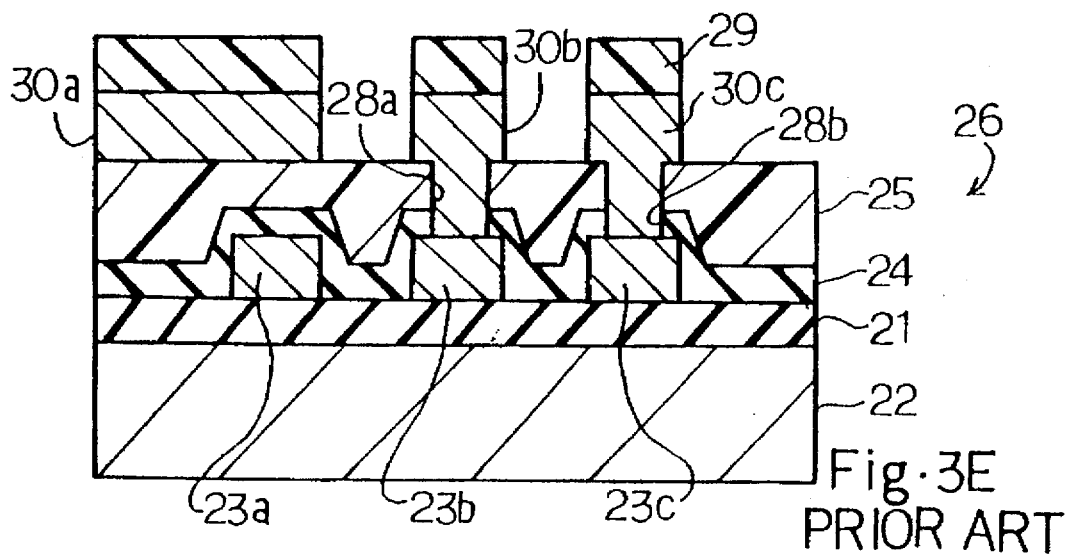
Figure 3F:
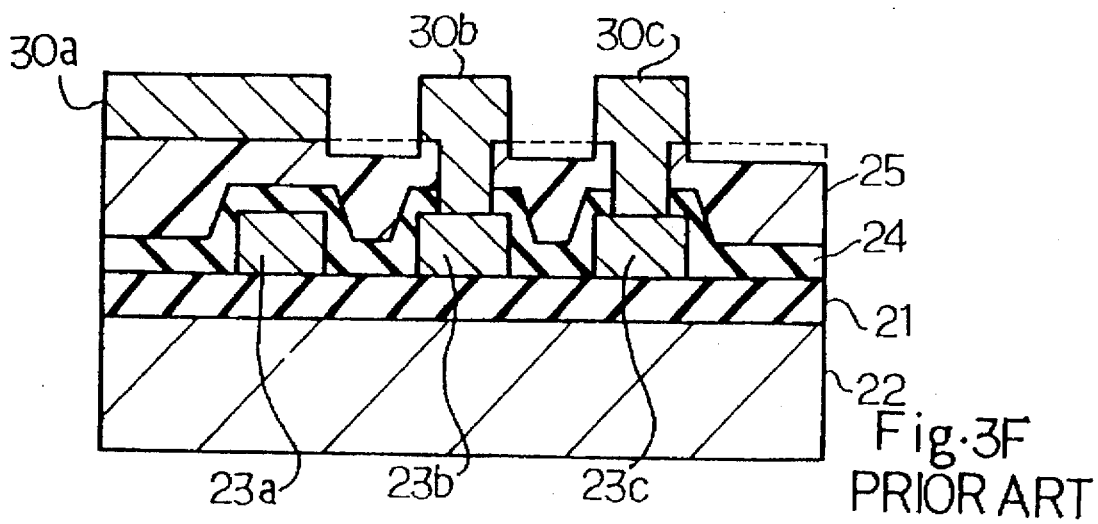
Figure 4:
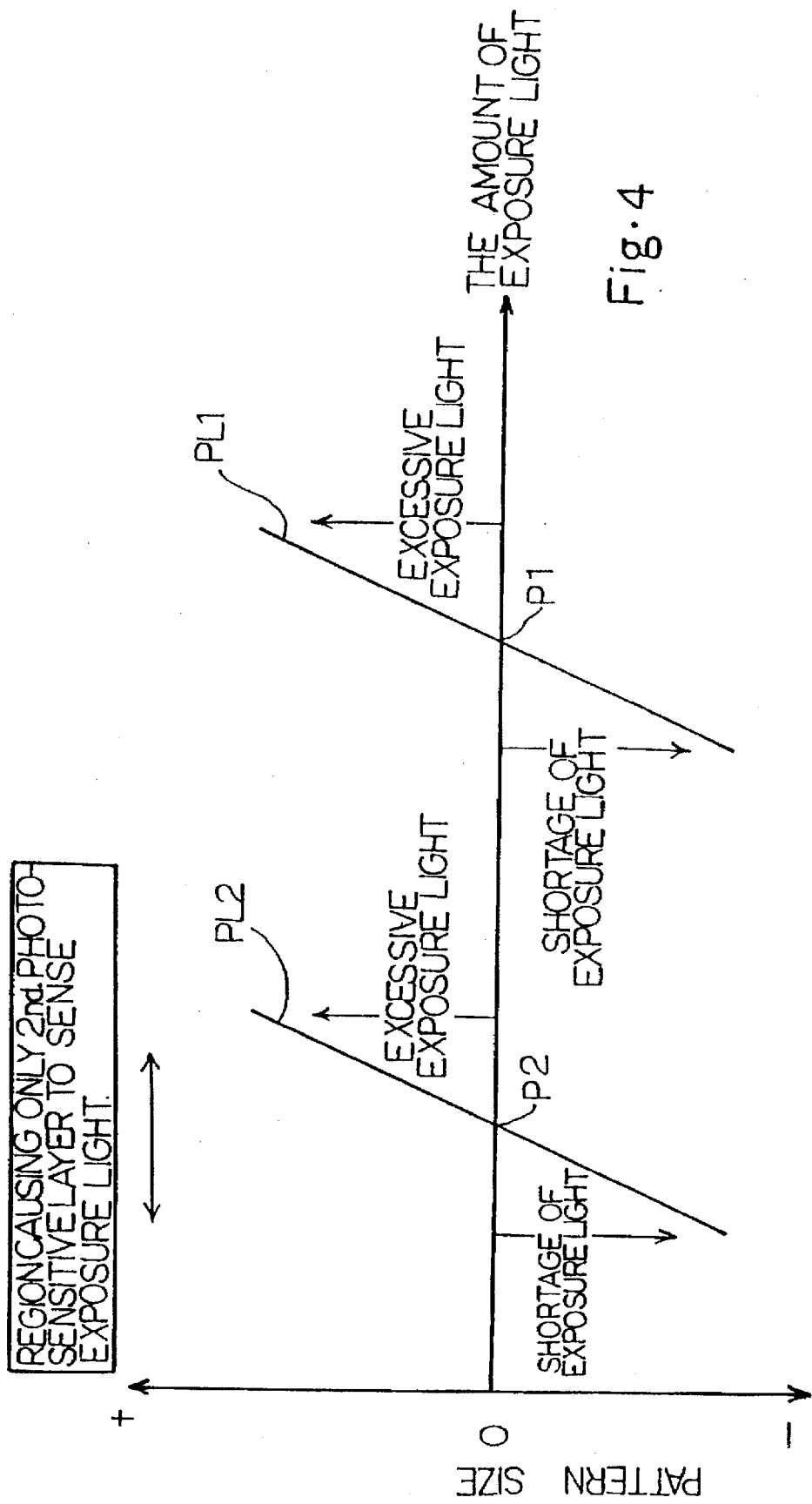
FIG. 4 is a graph showing the relation between a pattern size transferred to a photo-sensitive layer and the amount of exposure light incident on the photo-sensitive layer.

FIG. 4 illustrates the relation between a pattern size transferred to a photo-sensitive layer and the amount of exposure light incident on the photo-sensitive layer. The photo-sensing characteristics of a first photo-sensitive material is represented by plots PL1, and the other plots PL2 stand for the photo-sensing characteristics of a second photo-sensitive material. A pattern image is carried on the exposure light, and the exposure light transfers the pattern image to a first photo-sensitive layer of the first photo-sensitive material and a second photo-sensitive layer of the second photo-sensitive material. When the exposure light is adjusted to "P1", a latent image equal in pattern size to the pattern image is formed in the first photo-sensitive layer. Similarly, if the exposure light is adjusted to "P2", the latent image in the second photo-sensitive layer is equal in pattern size to the pattern image.

Thus, the photo-sensing characteristics are different between the first photo-sensitive material and the second photo-sensitive material, and appropriately adjusted exposure light makes only the second photo-sensitive layer to form a latent image without an influence on the first photo-sensitive layer.

Figure 5A:
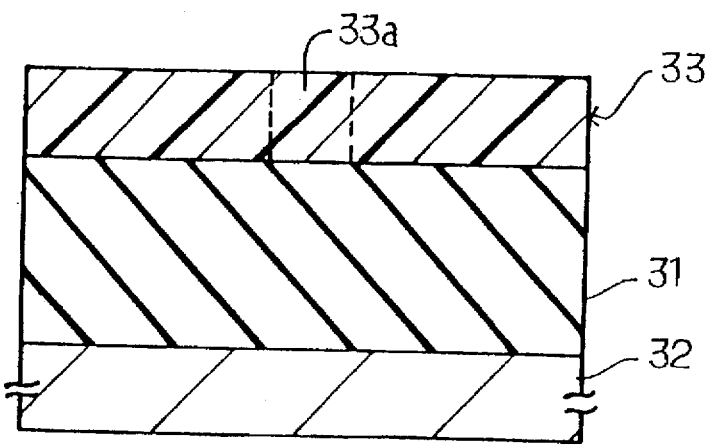
FIGS. 5A to 5F are cross sectional views showing a process of fabricating a multi-level wiring structure according to the present invention.

A selective pattern transfer according to the present invention is carried out on the basis of the different photo-sensing characteristics between a lower photo-sensitive layer and an upper photo-sensitive layer. Firstly, an inter-level insulating layer 31 is formed on a semiconductor substrate 32. Another inter-level insulating layer may be interposed between the semiconductor substrate 32 and the inter-level insulating layer 31. In this instance, no wiring is formed in the inter-level insulating layer 31, and wirings are formed in an inter-level organic insulating layer. However, wirings may be formed in the inter-level insulating layer 31. In case where wirings are formed in the inter-level insulating layer 31, the inter-level insulating layer 31 is formed of organic material. The inter-level insulating layer 31 is overlain by a lower photo-sensitive resin layer 33, and a first pattern image is optically transferred to the lower photo-sensitive resin layer 33. Then, a first latent image 33a is formed in the lower photo-sensitive resin layer 33 as shown in FIG. 5A.

Figure 5B:
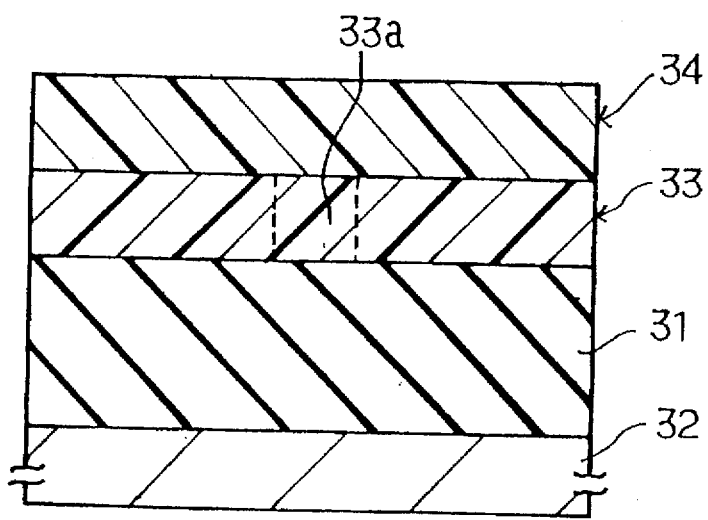

An upper photo-sensitive resin layer 34 is laminated on the lower photo-sensitive resin layer 33 without development of the first latent image 33a as shown in FIG. 5B. The upper photo-sensitive resin layer 34 is larger in photo-sensitivity than the lower photo-sensitive resin layer 33, and is uniform in thickness, because the lower photo-sensitive resin layer 33 has not been patterned, yet.

Figure 5C:
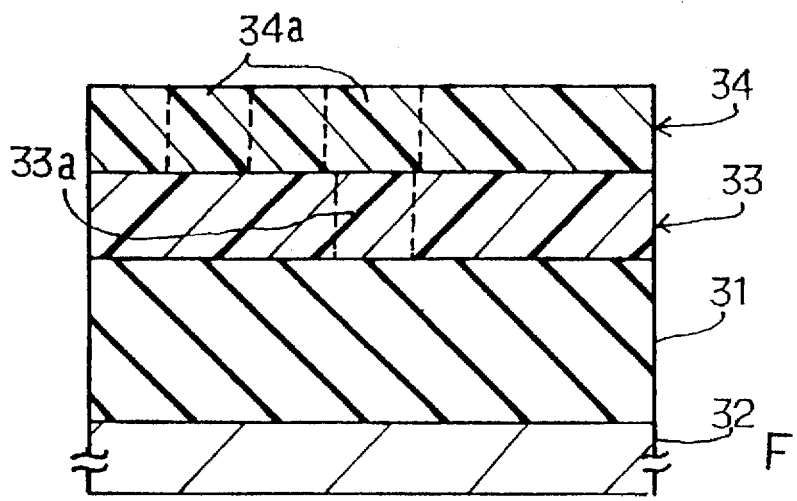

Thereafter, a second pattern image is optically transferred to the upper photo-sensitive resin layer 34, and a second latent image 34a is appropriately formed in the upper photo-sensitive resin layer 34 by virtue of the uniform thickness as shown in FIG. 5C. The intensity of exposure light and the exposure time are appropriately adjusted in such a manner that the exposure light does not have an influence on the lower photo-sensitive resin layer 33.

Figure 5D:
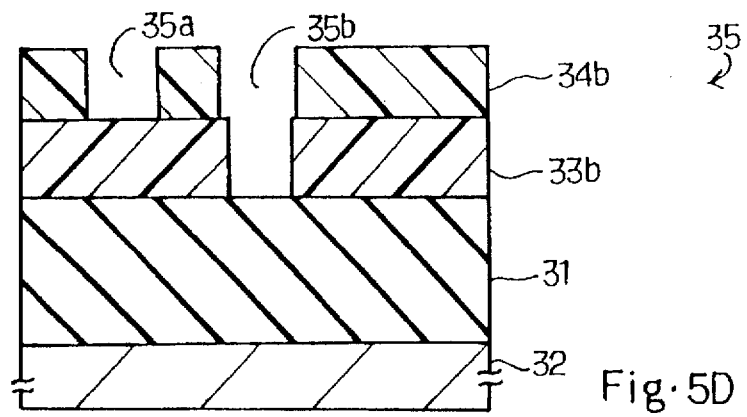

The first and second latent images are concurrently developed as shown in FIG. 5D. Then, the lower photo-sensitive resin layer 33 and the lower photo-sensitive resin layer 34 are differently patterned into patterned resin layers 33b and 34b, and the patterned resin layers 33b and 34b form in combination an inter-level organic insulating layer 35. A shallow pattern 35a is used as a wiring groove, and another wiring with a vertical interconnection is formed in a partially deep pattern 35b. Thus, the lower and upper photo-sensitive resin layers 33 and 34 are concurrently developed, and the concurrent image development makes the pattern transfer simple.

Figure 5E:
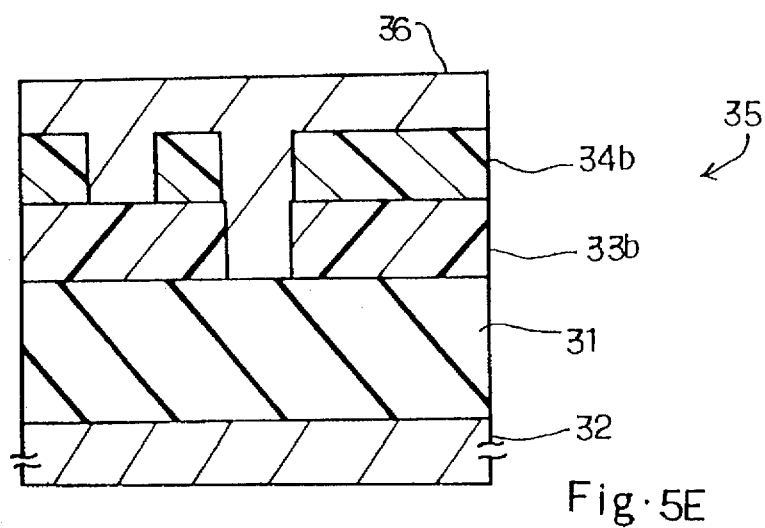

Conductive substance is deposited over the entire surface of the resultant structure shown in FIG. 5D. The conductive substance fills the shallow pattern 35a and the partially deep pattern 35b, and swells into a conductive layer 36 as shown in FIG. 5E.

Figure 5F:
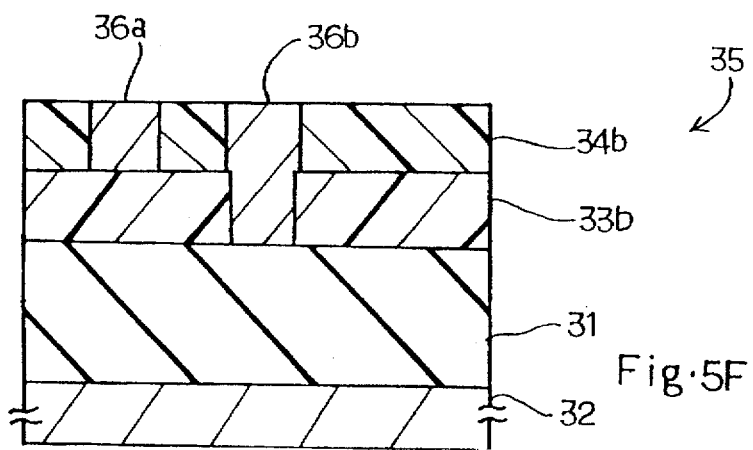

The conductive layer 36 is uniformly etched without an etching mask until the upper photo-sensitive resin layer 34b is exposed. As a result, a wiring 36a is formed in the shallow pattern, and another wiring 36b is formed in the partially deep pattern. A part of the wiring 36b penetrates through the inter-level organic insulating layer 35 as shown in FIG. 5F, and is held in contact with a lower wiring (not shown) on the inter-level insulating layer 31.

Figure 6A:
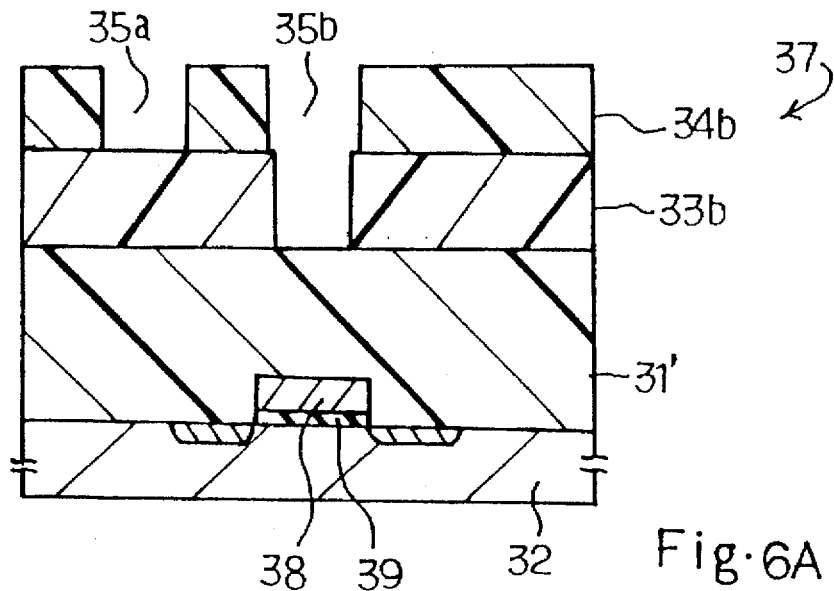
FIGS. 6A and 6D are cross sectional views showing essential steps of another process of fabricating a multi-level wiring structure according to the present invention.

The patterned resin layers 33b and 34b may be used as a composite photo-sensitive etching mask 37. The patterned resin layers are also made by the other process sequence as follows. The resin layer 33b of photo-sensitive etching mask are patterned to make the holes 35b. Then, the resin layer 34b of the same photo-sensitive etching mask as 33b are coated, and are patterned to make shallow patterns as wiring trenches 35a and 35b. In this instance, the inter-level insulating layer 31' is formed of organic material, and a lower conductive layer such as a gate electrode 38 is formed on a gate insulating layer 39 under the deep pattern 35b as shown in FIG. 6A. The structure shown in FIG. 6A is corresponding to the structure shown in FIG. 5D, and the lower and the upper photo-sensitive layers 33 and 34 are patterned into the composite photo-sensitive etching mask 37 as similar to the inter-level organic insulating layer 35 on the basis of the difference in photo-sensitivity therebetween.

Figure 6B:
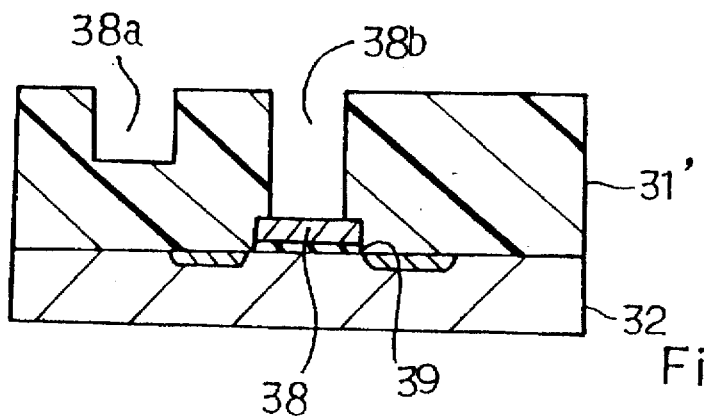

The structure shown in FIG. 6A is placed in a dry etching system (not shown), and is exposed to oxygen plasma or mixed gas plasma of $CHF_3$ and $O_2$ in which $O_2$ concentration is less than 30 percent. The gas composition of (i) $CHF_3$—$O_2$—Ar, (ii) $CF_4$—$O_2$—Ar or (iii) $CF_4$—Ar reveals the same etching properties as $O_2$—$CHF_3$. The oxygen plasma ashes the composite photo-sensitive etching mask 37 and the inter-level insulating layer 31' partially exposed thereto, and the shallow pattern 35a and the deep pattern 35b are transferred to the inter-level insulating layer 31'. As a result, a shallow groove 38a and a partially deep groove 38b are formed in the inter-level insulating layer 31' as shown in FIG. 6B. The partially deep groove has a through-hole, and the gate electrode 39 is exposed to the through-hole.

Figure 6C:
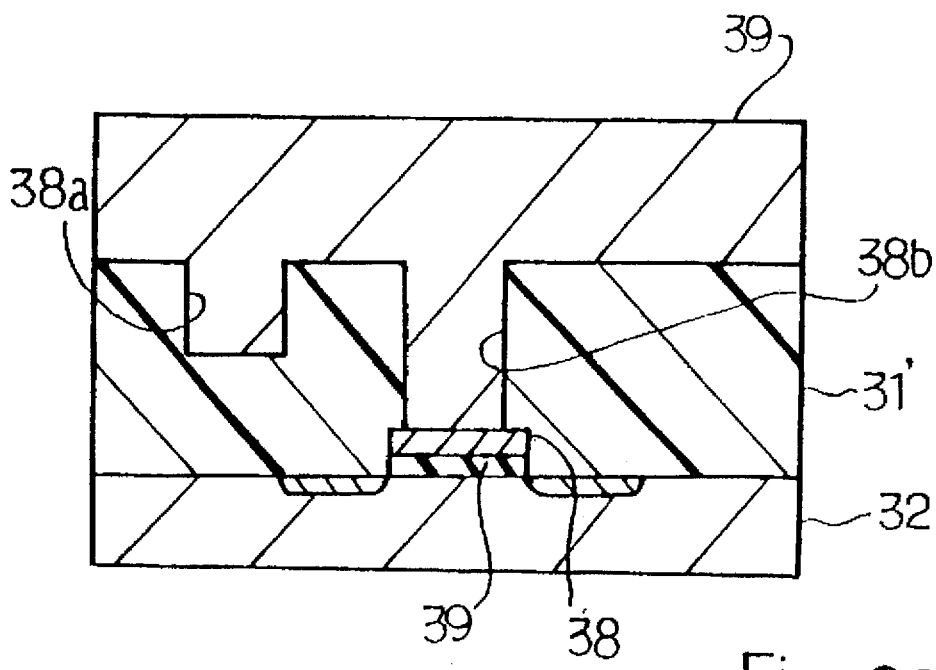

Subsequently, conductive substance is deposited over the entire surface of the resultant structure shown in FIG. 6B. The conductive substance fills the shallow groove 38a and the partially deep groove 38b, and swells into a conductive layer 39 as shown in FIG. 6C.

Figure 6D:
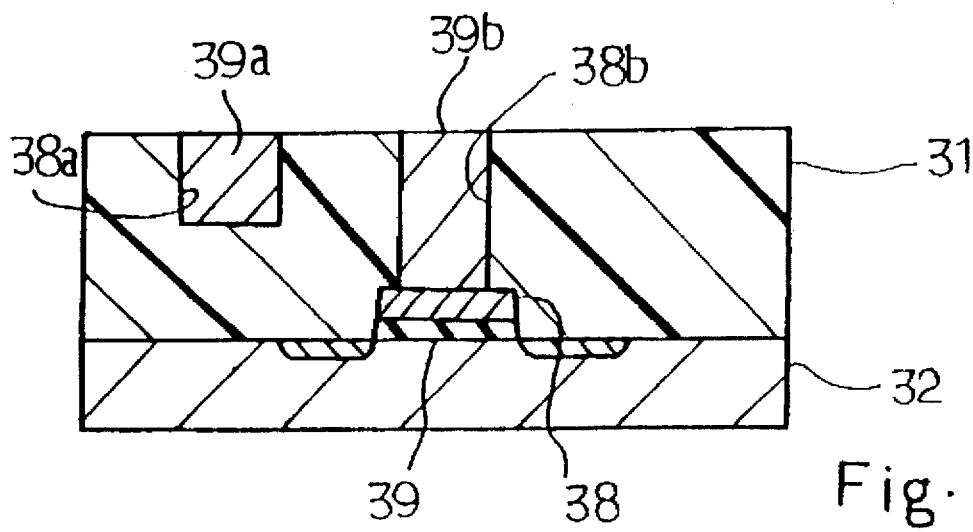

The conductive layer 39 is chemically mechanically polished until the inter-level insulating layer 31' is exposed, and upper wirings 39a and 39b are left in the shallow groove 38a and the partially deep groove 38b, respectively. The resultant structure is illustrated in FIG. 6D.

Thus, the first and second latent images in the photo-sensitive resin layers 33 and 34 are concurrently developed, and the patterned resin layers 33b and 34b from the inter-level organic layer 35 and the composite photo-sensitive etching mask 37.

DESCRIPTION OF THE PREFERRED EMBODIMENTS

First Embodiment

FIGS. 7A to 7F illustrate a process of fabricating a semiconductor integrated circuit device embodying the present invention. The process sequence starts with preparation of a semiconductor substrate such as a silicon substrate 41, and a field oxide layer 42 is selectively grown so as to define active areas in the major surface. The active areas are selectively assigned to circuit components of an integrated circuit, and a field effect transistor 43 is fabricated on one of the active areas 41a. Although other circuit components are fabricated on the silicon substrate 41 together with the field effect transistor 43, description is made on the field effect transistor 43, only, for the sake of simplicity.

A thin silicon oxide layer 43a is thermally grown on the active area 41a, and a gate electrode 43b is patterned from a conductive layer on the thin silicon oxide layer 43a. Dopant impurity is ion implanted into the active area 41a in a self-aligned manner with the gate electrode 43b, and source and drain regions 43c and 43d are formed in the active area 41a.

Figure 7A:
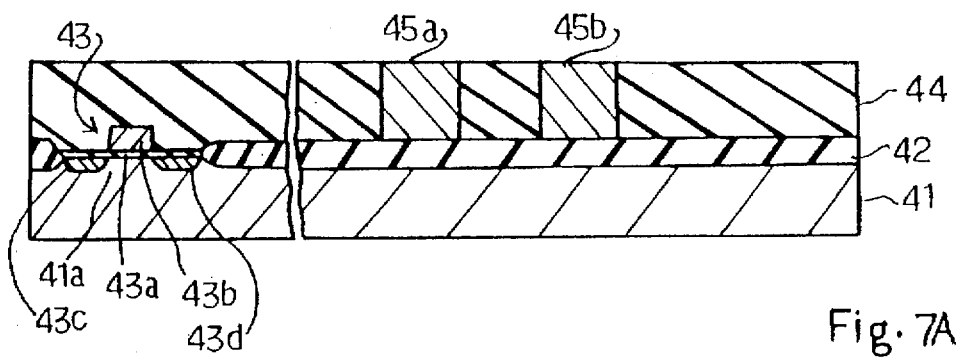
FIGS. 7A to 7F are cross sectional views showing a process of fabricating a semiconductor integrated circuit device according to the present invention.

Silicon oxide is deposited over the entire surface of the structure, and the field effect transistor 43 and the field oxide layer 42 are overlain by a silicon oxide layer 44. Lower wirings 45a and 45b are buried in the silicon oxide layer 44, and are, by way of example, formed of aluminum. The upper surfaces of the lower wirings 45a/45b are substantially coplanar with the upper surface of the silicon oxide layer 44. The resultant structure is illustrated in FIG. 7A.

Subsequently, two kinds of photo-sensitive polyimide are prepared. The first kind of photo-sensitive polyimide is lower in photo-sensitivity than the second kind of photo-sensitive polyimide.

Firstly, the first kind of photo-sensitive polyimide is spread over the entire surface of the silicon oxide layer 44 and the lower wirings 45a and 45b, and a first photo-sensitive polyimide layer 46 extends over the silicon oxide layer 44 and the lower wirings 45a/45b. The first photo-sensitive polyimide layer 46 is uniform in thickness by virtue of the coplanar flat surfaces of the lower wirings 45a/45b and the silicon oxide layer 44.

Figure 7B:
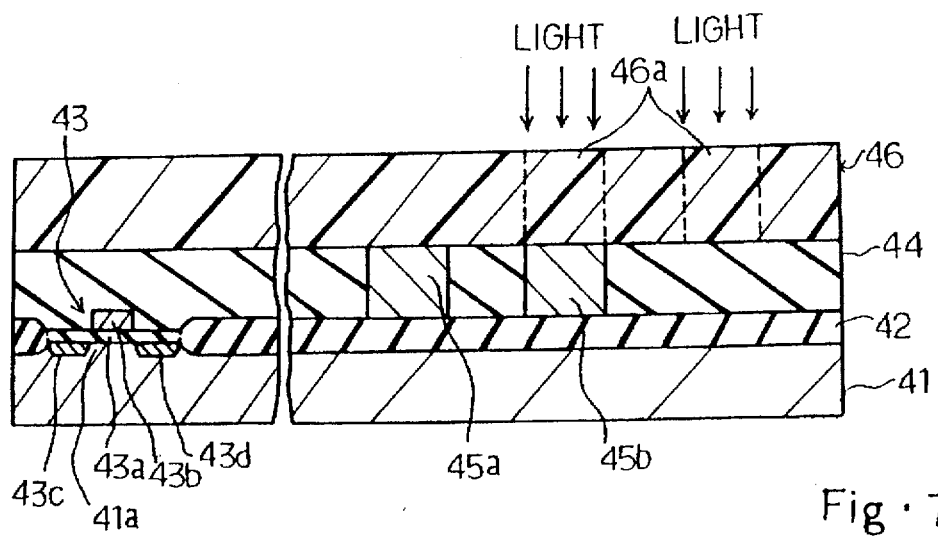

The first photo-sensitive polyimide layer 46 is exposed to light carrying an optical image of a first pattern for through-holes, and a latent image 46a of the first pattern is formed in the first photo-sensitive polyimide layer 46 as shown in FIG. 7B. The first pattern is exactly transferred to the first photo-sensitive polyimide layer 46 by virtue of the uniform thickness of the first photo-sensitive polyimide layer 46.

Figure 7C:
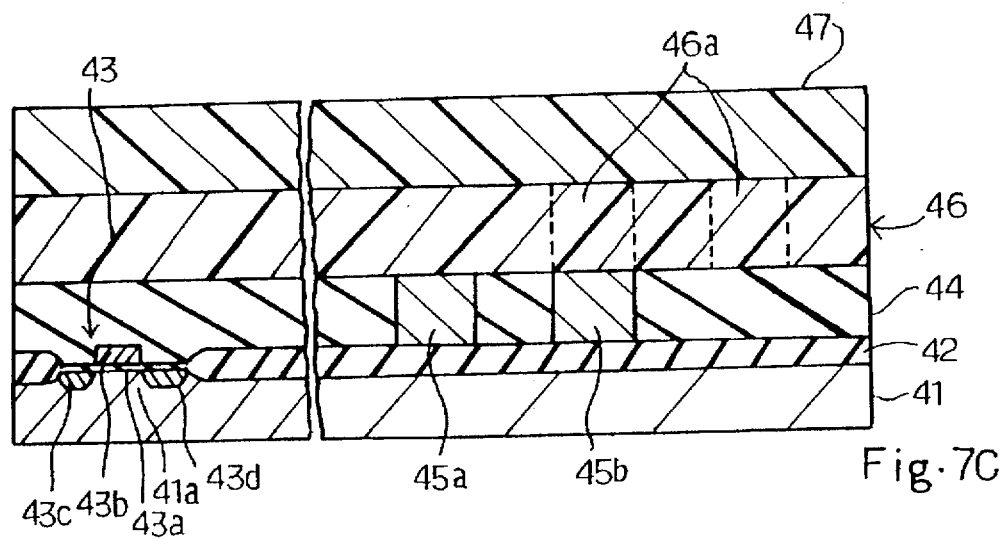

The latent image 46a is not developed, and, accordingly, the upper surface of the first photo-sensitive polyimide layer 46 is flat and smooth. The second kind of photo-sensitive polyimide is spread over the first photo-sensitive polyimide layer 44 and a second photo-sensitive polyimide layer 47 is formed on the first photo-sensitive polyimide layer 44 as shown in FIG. 7C. The second photo-sensitive polyimide layer 47 is higher in photo-sensitivity than the first photo-sensitive polyimide layer 46, and is uniform in thickness.

The second photo-sensitive polyimide layer 47 is exposed to light carrying an optical image of a second pattern for wiring grooves, and a second latent image 47a is formed in the second photo-sensitive polyimide layer 47. The amount of exposure light or the intensity of light and the time for the exposure are appropriately adjusted in such a manner that the exposure light does not make the first photo-sensitive polyimide layer 46 sense the light. For this reason, the second pattern is never transferred to the first photo-sensitive polyimide layer 46, and is exactly transferred to the second photo-sensitive polyimide layer 47 by virtue of the uniform thickness of the second photo-sensitive polyimide layer 47.

Figure 7D:
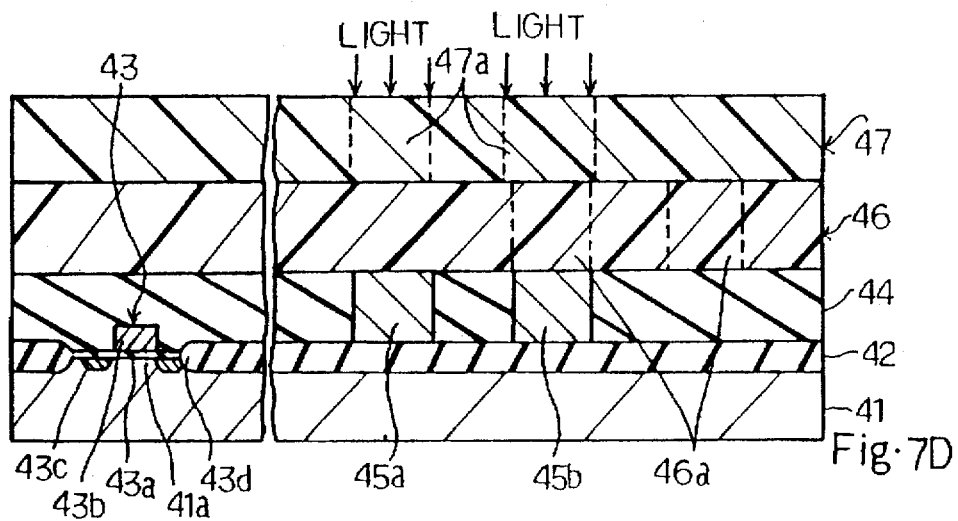
Figure 7E:
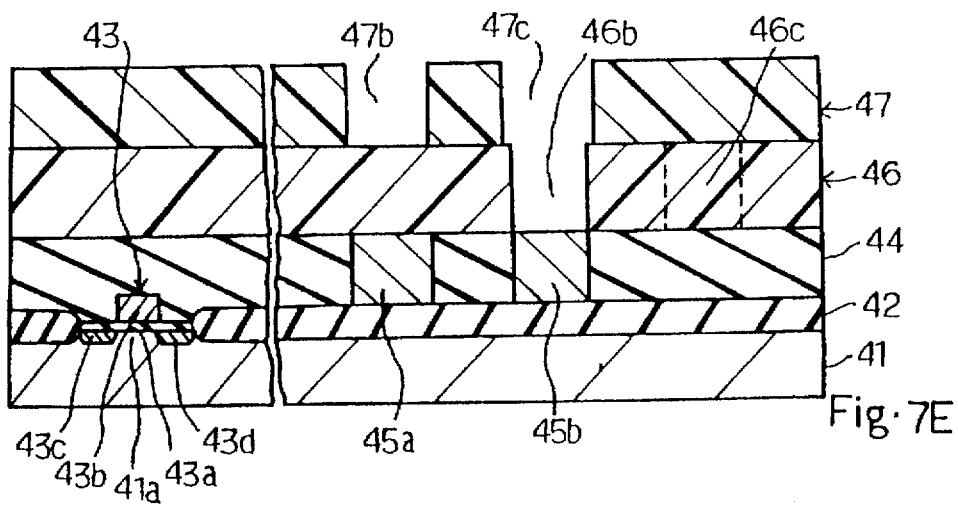

The resultant structure shown in FIG. 7D is dipped into developing solution, and the first and second latent images 46a and 47a are concurrently developed. A though-hole 46b is formed in the first photo-sensitive polyimide layer 46; however, a part 46c of the first latent image 46a is never developed, because the part 46c of the first latent image 46a is covered with the non-developed second photo-sensitive polyimide layer 47. On the other hand, the second latent image 47a is fully developed, and wiring grooves 47b and 47c are formed in the second photo-sensitive polyimide layer 47 as shown in FIG. 7E. The lower wiring 45b is exposed to the through-hole 46b, and the through-hole 46b is connected to the wiring groove 47c.

Figure 7F:
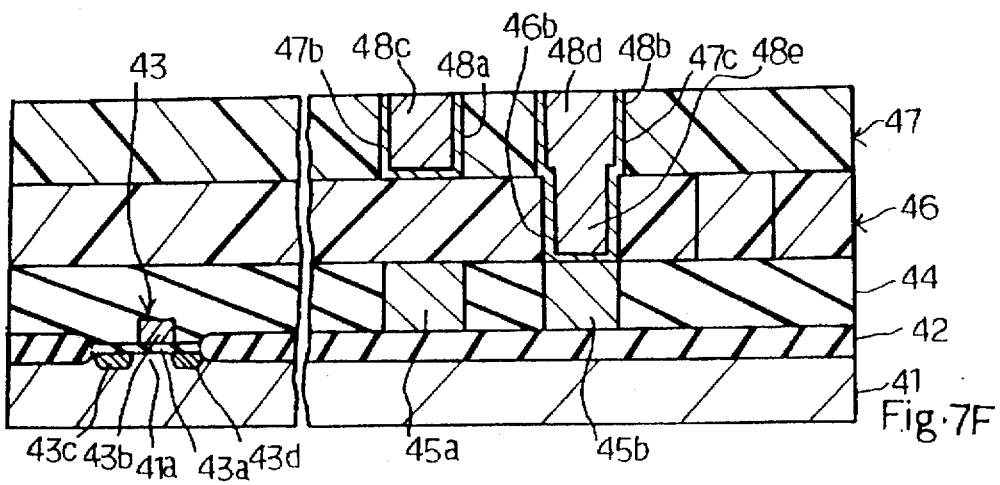

Subsequently, titanium nitride (TiN) is deposited over the entire surface of the resultant structure shown in FIG. 7E by using a chemical vapor deposition, and a titanium nitride layer is topographically extends on the exposed surface. Aluminum is further deposited over the titanium nitride layer by using a chemical vapor deposition. The aluminum fills the openings defined by the titanium nitride layer, and swells into an aluminum layer over the upper surface of the second photo-sensitive polyimide layer 47. The aluminum layer and the titanium nitride layer are subjected to a chemical mechanical polishing until the second photo-sensitive polyimide layer 47 is exposed. As a result, barrier layers 48a and 48b of titanium nitride, upper wirings 48c and 48d of aluminum and a vertical interconnection 48e of aluminum are left in the wiring grooves 47b/47c and the through-hole 46b as shown in FIG. 7F. The vertical interconnection 48e is merged with the upper wiring 48d. The upper wirings 48c/48d are used as global wirings connected between circuit blocks of the integrated circuit. The first and second photo-sensitive polyimide layers 46 and 47 form in combination an inter-level organic insulating layer, and the inter-level organic insulating layer is overlain by an upper inter-level insulating layer (not shown).

As will be understood from the foregoing description, the first and second patterns are exactly transferred to the first and second photo-sensitive polyimide layers 46 and 47 uniform in thickness, respectively, and wiring grooves 47b and 47c are narrow. This results in the narrow upper wirings 48c and 48d. Moreover, the dielectric constant of the polyimide is small. For this reason, even though the lower wiring 45a is overlapped with the upper wiring 48c, parasitic capacitance is small, and the upper wirings 48c/48d propagate signals at high speed.

The first and second latent images 46a and 47a are concurrently developed, and process steps are less than those of the prior art processes. The upper wirings 48c and 48d are embedded in the second photo-sensitive polyimide layer 47, and are reliable.

Second Embodiment

FIGS. 8A to 8H illustrate another process sequence embodying the present invention. Although a semiconductor integrated circuit device is fabricated through the process sequence, only a multi-level wiring structure is illustrated in FIGS. 8A to 8G. In this instance, an inter-level insulating layer is formed of benzocyclobutene. The benzocyclobutene is known as organic insulating material with a small dielectric constant, and the dielectric constant is 2.7. A pattern transfer to the inter-level insulating layer of benzocyclobutene requires an etching mask, and the etching mask is formed from two kinds of positive photo-resist. In this instance, dye is mixed into high sensitive positive photo-resist so as to decrease the photo-sensitivity. Therefore, one kind of positive photo-resist contains the dye, and the photo-sensitivity is relatively small. On the other hand, the other kind of positive photo-resist does not contain the dye, and has large photo-sensitivity. While the dye-containing positive photo-resist is being exposed to light for 700 milliseconds to 800 milliseconds, the dye-containing positive photo-resist senses the light, and a latent image is formed therein. On the other hand, while the high sensitive positive photo-resist is being exposed to light for 150 milliseconds to 200 milliseconds, a latent image is formed in the high sensitive positive photo-resist layer.

Figure 8A:
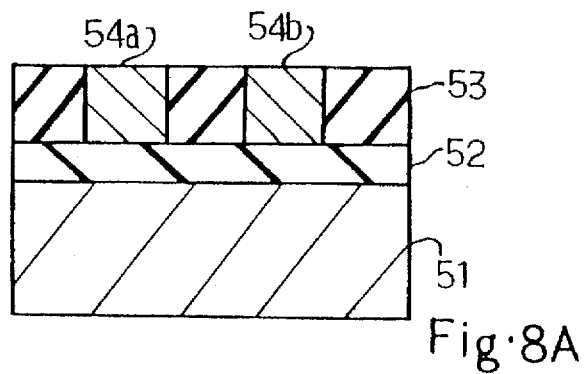
FIGS. 8A to 8H are cross sectional views showing another process according to the present invention.

The process sequence implementing the second embodiment starts with preparation of a semiconductor substrate 51, and the major surface of the semiconductor substrate 51 is covered with an insulating layer 52. The insulating layer 52 is overlain by a silicon oxide layer 53, and lower wirings 54a and 54b of aluminum are embedded into the silicon oxide layer 53. The upper surfaces of the lower wirings 54a and 54b are coplanar with the upper surface of the silicon oxide layer 53, and the lower wirings 54a and 54b and the silicon oxide layer 5 form a smooth top surface as shown in FIG. 8A.

Figure 8B:
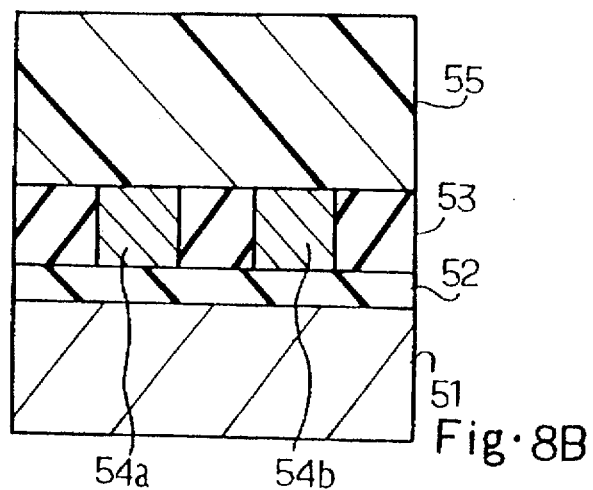

Benzocyclobutene is spun onto the smooth top surface, and is baked in nitrogen atmosphere at 250 degrees to 300 degrees in centigrade so as to form the inter-level organic insulating layer 55. The benzocyclobutene layer preferably ranges from 2000 angstroms thick to 20000 angstroms thick. In this instance, the benzocyclobutene layer is regulated to 10000 angstroms thick. The resultant structure is illustrated in FIG. 8B.

Figure 8C:
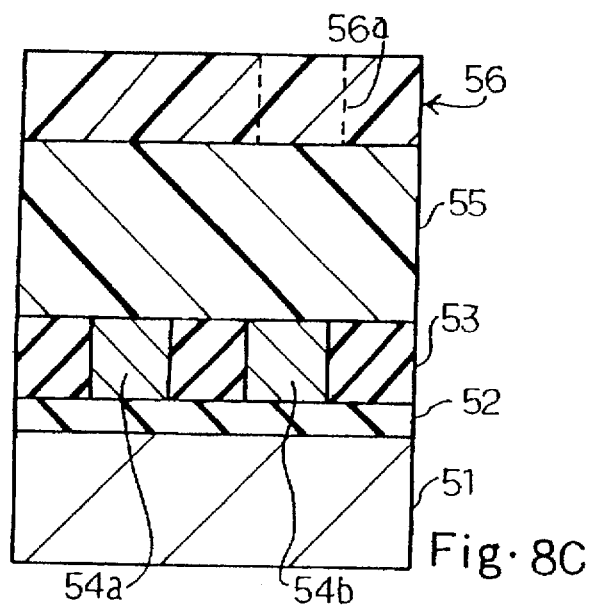

Subsequently, the dye-containing positive photo-resist is spread over the entire surface of the inter-level organic insulating layer 55, and forms a first photo-resist layer 56 of 5000 angstroms thick. The smooth top surface causes the first photo-resist layer 56 to be uniform in thickness. A first pattern for a through-hole is optically transferred to the first photo-resist layer 56 by exposing the first photo-resist layer 56 to light carrying the first pattern for 750 millisecond. A first latent image 56a for the through-hole is exactly formed in the first photo-resist layer 56 by virtue of the uniform thickness. The resultant structure is illustrated in FIG. 8C. The first photo-resist layer 56 may be subjected to a post exposure baking after the formation of the latent image 56.

Subsequently, the high sensitive positive photo-resist is spread over the first positive photo-resist layer 56, and the first positive photo-resist layer 56 is overlain by a second positive photo-resist layer 57. The first latent image 56a has not been developed, yet, and the upper surface of the first positive photo-resist layer 56 is smooth. For this reason, the second positive photo-resist layer 57 is uniform in thickness. In this instance, the second positive photo-resist layer 57 is regulated to 5000 angstroms thick.

Figure 8D:
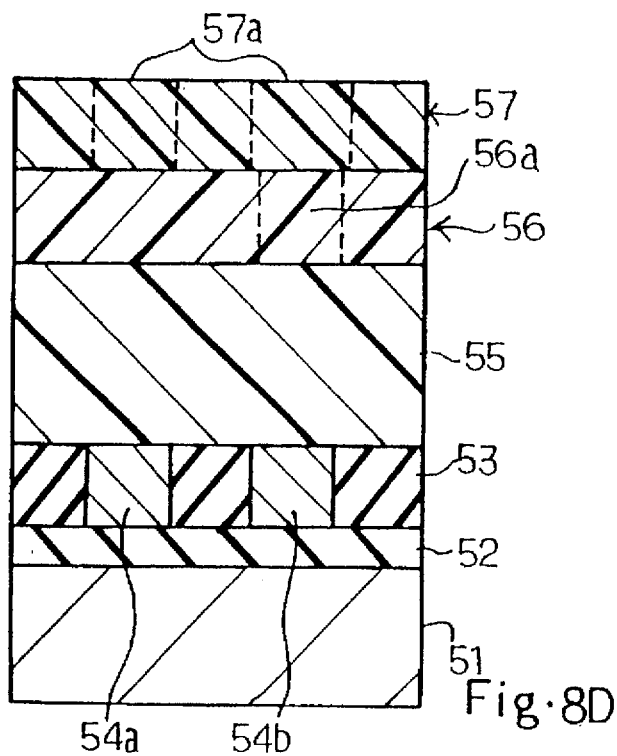

A second pattern for wiring grooves is optically transferred to the second positive photo-resist layer 57, and the light carrying the second pattern exactly forms a second latent image 57a in the second positive photo-resist layer 57 by virtue of the uniform thickness as shown in FIG. 8D.

In this instance, the second positive photo-resist layer 57 is exposed to the light for 150 millisecond, and the first positive photo-resist layer 56 does not sense the light. Even if the exposure light reaches the first positive photo-resist layer 56, only an extremely thin surface portion senses the light, and the exposure of light does not have a serious influence on the first positive photo-resist layer 56.

After the pattern transfer to the second positive photo-resist layer 57, the second positive photo-resist layer 57 may be subjected to a post exposure baking around 100 degrees in centigrade.

Figure 8E:
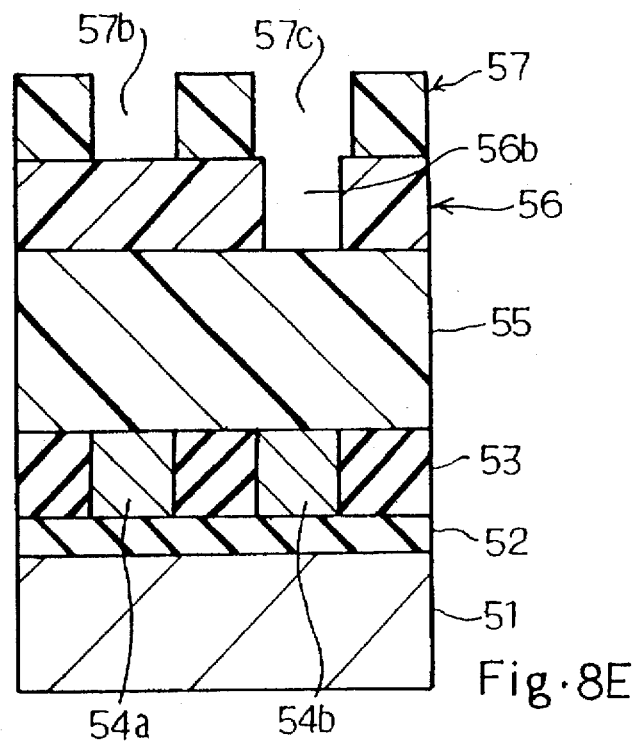

Subsequently, developing solution is applied to the first and second positive photo-resist layers 56 and 57, and the first pattern 56b for the through-hole and the second pattern 57b/57c for the wiring grooves are formed in the first positive photo-resist layer 56 and the second positive photo-resist layer 57, respectively, as shown in FIG. 8E. The first and second photo-resist layers 56 and 57 form in combination a composite photo-resist etching mask.

The structure of FIG. 8 is also made by using another process sequence as follows. The first positive photo-resist layer 56 is patterned to make through-hole 56b, and then are baked at 130 degrees in centigrade for 30 minutes. The second positive photo-resist is coated on the first photo-resist layer patterned. The second photo-resist is the same chemical product as the first one. The second photo-resist is patterned to make wiring grooves 57b/57c.

Even if the first latent image 56a has an exposed portion beneath a non-exposure portion of the second positive photo-resist layer 57, the developing solution does not reach the exposed portion, and the through-hole 56b is certainly formed under the wiring groove.

Figure 8F:
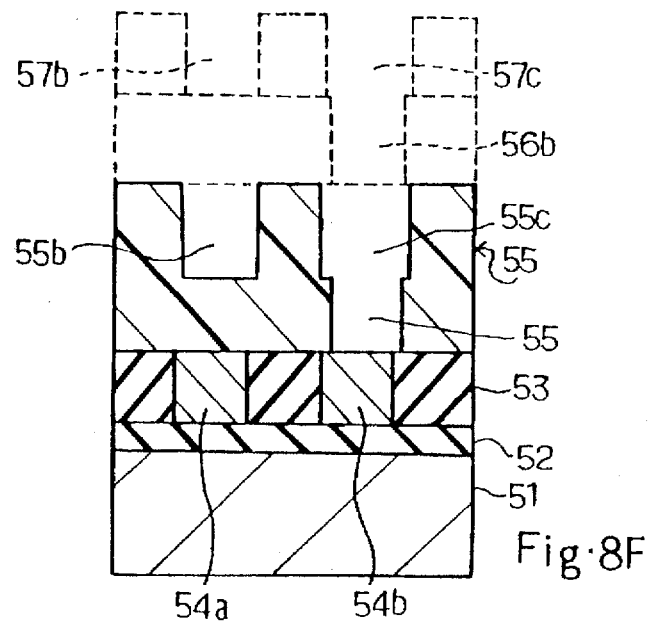

Subsequently, a dry etching is carried out using gaseous mixture of $O_2$, $CHF_3$ and Ar. The etching condition is, by way of example, as follows. The radio-frequency power is 200 watts, and the pressure is 2 milli-torr. The gas composition of $O_2$—$CHF_3$, $O_2$—$CF_4$ and $O_2$—$SF_6$ achieve similar etching characteristics to $O_2$—$CHF_3$—Ar. The typical gas condition is $O_2$ at 10 percent and $CHF_3$ at 90 percent. The etching conditions are regulated in such a manner that the benzocyclobutene, the dye-containing positive photo-resist and the highly sensitive positive photo-resist are etched at the same speed. As a result, the first pattern 56b and the second pattern 57b/57c are transferred to the inter-level organic insulating layer 55, and a through-hole 55a and the wiring grooves 55b/55c are formed in the inter-level organic insulating layer 55 as shown in FIG. 8F. The lower wiring 54b is exposed to the through-hole 55a, and the wiring groove 55c is connected to the through-hole 55a. While the first and second patterns 56b and 57b/57c are being transferred to the inter-level organic insulating layer 55, the first and second positive photo-resist layers 56 and 57 are etched away.

Figure 8G:
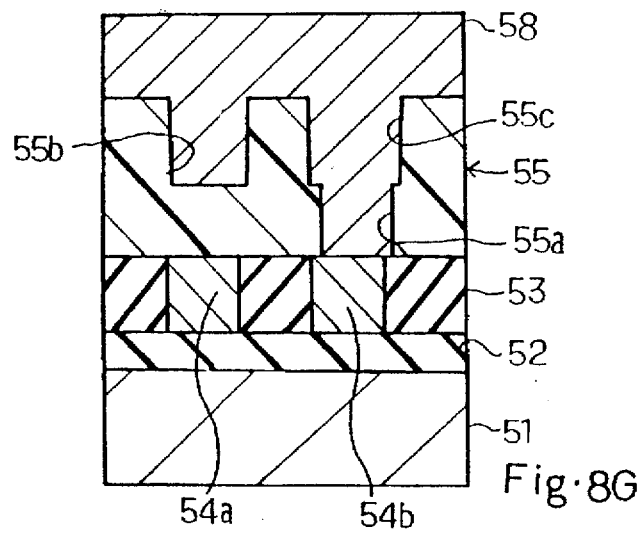

Copper is deposited over the entire surface of the structure by using a chemical vapor deposition. The copper fills the through-hole 55a and the wiring grooves 55b/55c, and swells into a copper layer 58 as shown in FIG. 8G.

Figure 8H:
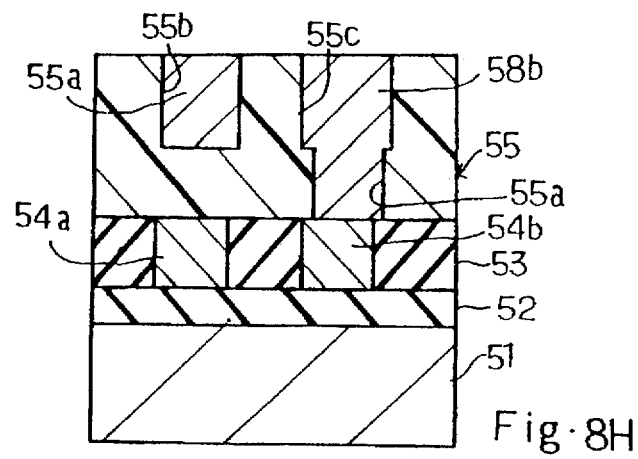

The copper layer 58 is uniformly removed by using a chemical mechanical polishing until the inter-level organic insulating layer 55 is exposed, and silica-containing slurry is supplied to a polishing pad so as to create a smooth top surface. As a result, upper wirings 58a and 58b are left in the wiring grooves 55b and 55c as shown in FIG. 8H, and the upper wiring 58b is held in contact with the lower wiring 54b through the through-hole 55a. The upper wirings 58a and 58b are covered with an upper inter-level insulating layer (not shown).

As will be understood, the composite photo-resist etching mask is formed on the inter-level organic insulating layer 55 through a simple process sequence. The first and second patterns are exactly transferred to the first and second positive photo-resist layers 56 and 57, respectively, before the development of the latent images, and the wiring grooves are not undesirably widened. As a result, the upper wirings are as narrow as designed, and the narrow line width and the small dielectric constant of the benzocyclobutene effectively decrease the parasitic capacitance coupled to the upper wiring 58a. Moreover, the upper wirings 58a and 58b are embedded in the inter-level organic insulating layer 55, and are hardly broken. Thus, the multi-level wiring structure according to the present invention is reliable.

Third Embodiment

FIGS. 9A to 9E illustrate yet another process sequence embodying the present invention. A semiconductor integrated circuit device implementing the third embodiment has a multi-level wiring structure different from that of the second embodiment. The multi-level wiring structure of the third embodiment has low wirings patterned from an aluminum layer, and the lower wirings are covered with a silicon oxide layer.

Figure 9A:
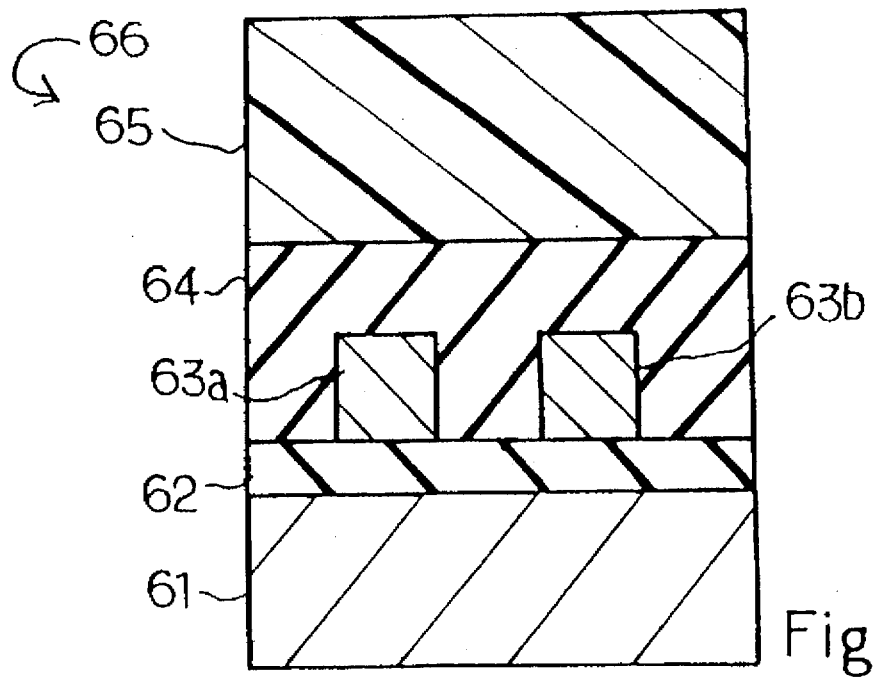
FIGS. 9A to 9E are cross sectional views showing yet another process according to the present invention.

The process starts with preparation of a semiconductor substrate 61 covered with an insulating layer 62. Aluminum is deposited on the insulating layer 62, and the aluminum layer is patterned into lower aluminum wirings 63a and 63b by using a lithography followed by a dry etching. Silicon oxide is deposited over the entire surface of the structure by using a chemical vapor deposition, and the lower aluminum wirings 63a and 63b are covered with a lower inter-level insulating layer 64 of silicon oxide. A smooth flat surface is created on the lower inter-level insulating layer 64 by using a chemical mechanical polishing. Benzocylrobutene is spun onto the smooth flat surface of the lower inter-level insulating layer 64, and the lower inter-level insulating layer 64 is overlain by a benzocyclobutene layer 65. The lower inter-level insulating layer 64 and the benzocyclobutene layer 65 form in combination an inter-level insulating structure 66, and the resultant structure is shown in FIG. 9A.

Figure 9B:
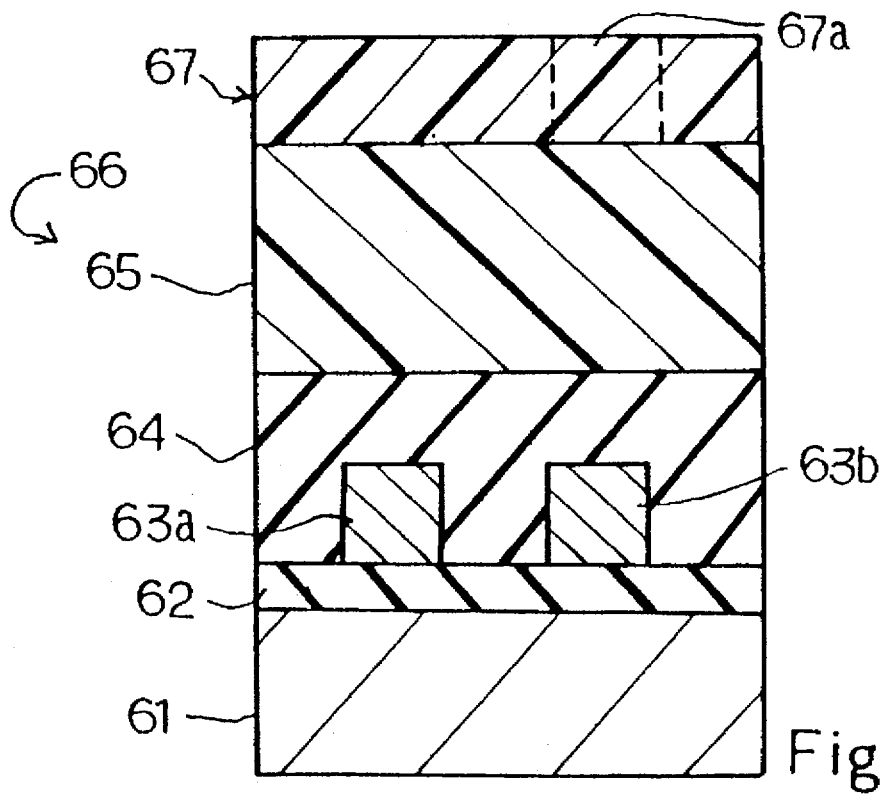

A first photo-resist layer 67 of low photo-sensitive resist is laminated on the benzocyclobutene layer 65, and a first pattern for a through-hole is optically transferred to the first photo-resist layer 67. A first latent image 67a is formed in the first photo-resist layer 67 as shown in FIG. 9B.

Figure 9C:
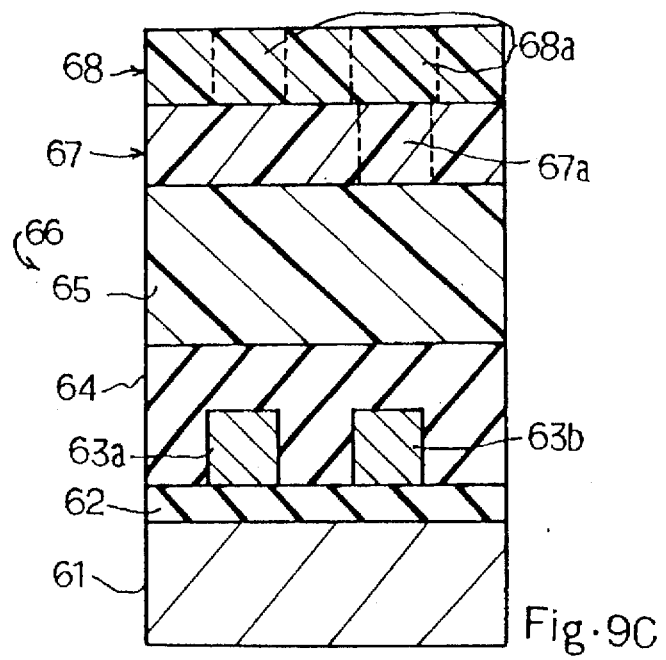

High photo-sensitive resist is spread over the first photo-resist layer 67, and the first photo-resist layer 67 is overlain by a second photo-resist layer 68. A second pattern for upper wirings is optically transferred to the second photo-resist layer 68, and a second latent image 68a is formed in the second photo-resist layer 68 as shown in FIG. 9C.

Figure 9D:
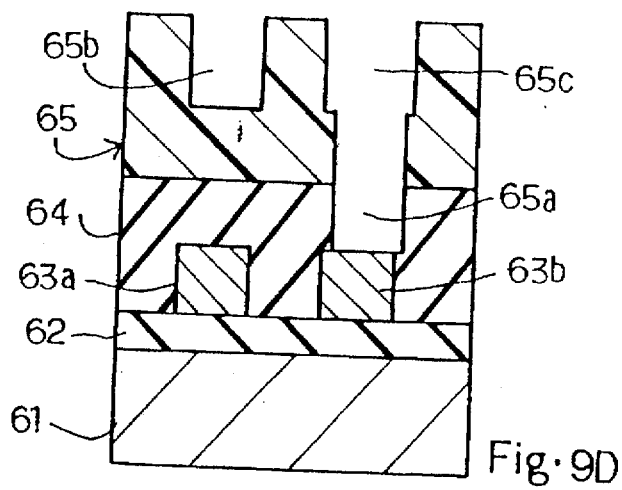

The first and second latent images 67a and 68a are concurrently developed, and the portions forming the first and second latent images 67a and 68a are removed from the first and second photo-resist layers 67 and 68. A through-hole and grooves are formed in the first and second photo-resist layers 67 and 68. The first and second photo-resist layers 67 and 68 form in combination a composite photo-resist structure, and is exposed to gaseous etchant in Ar-$O_2$ system. The through-hole and the grooves are transferred to the benzocyclobutene layer 65, and a hole and wiring grooves 65b and 65c are formed in the benzocyclobutene layer 65. The wiring grooves 65b and 65c are open to the upper surface of the benzocyclobutene layer 65, and the hole is open to the wiring groove 65c. The composite photo-resist structure is etched away during the pattern transfer to the benzocyclobutene layer 65. Using the benzocyclobutene layer 65 as an etching mask, the inter-level insulating layer is selectively etched by using gaseous etchant in Ar—$CF_4$ system, and a through-hole 65a is completed. The through-hole 65a is open at the lower end to the lower wiring 63b and at the upper end to the wiring groove 65c. The resultant structure is illustrated in FIG. 9D.

Figure 9E:
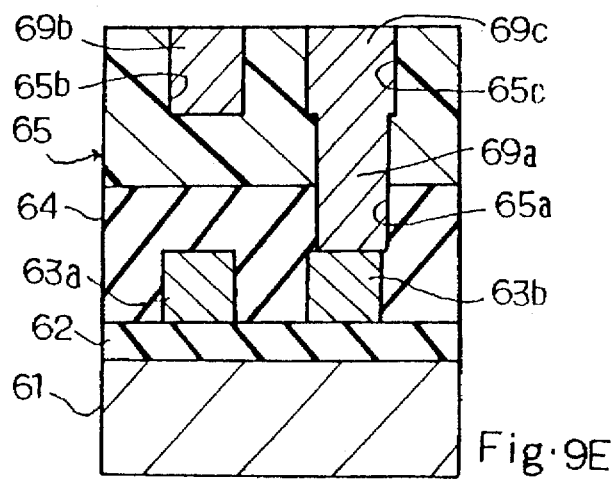

Copper is deposited over the entire surface of the structure by using a chemical vapor deposition. The copper fills the through-hole 65a and the wiring grooves 65b/65c, and swells into a copper layer. The copper layer is chemically mechanically polished until the benzocyclobutene layer 65 is exposed, again, and an interconnection 69a and upper wirings 69b and 69c are left in the through-hole 65a and the wiring grooves 65b/65c as shown in FIG. 9E. The upper wirings 69b and 69c are overlain by an upper inter-level insulating layer (not shown).

The multi-level wiring structure and the process achieve all the advantages of the second embodiment.

Fourth Embodiment

Figure 10:
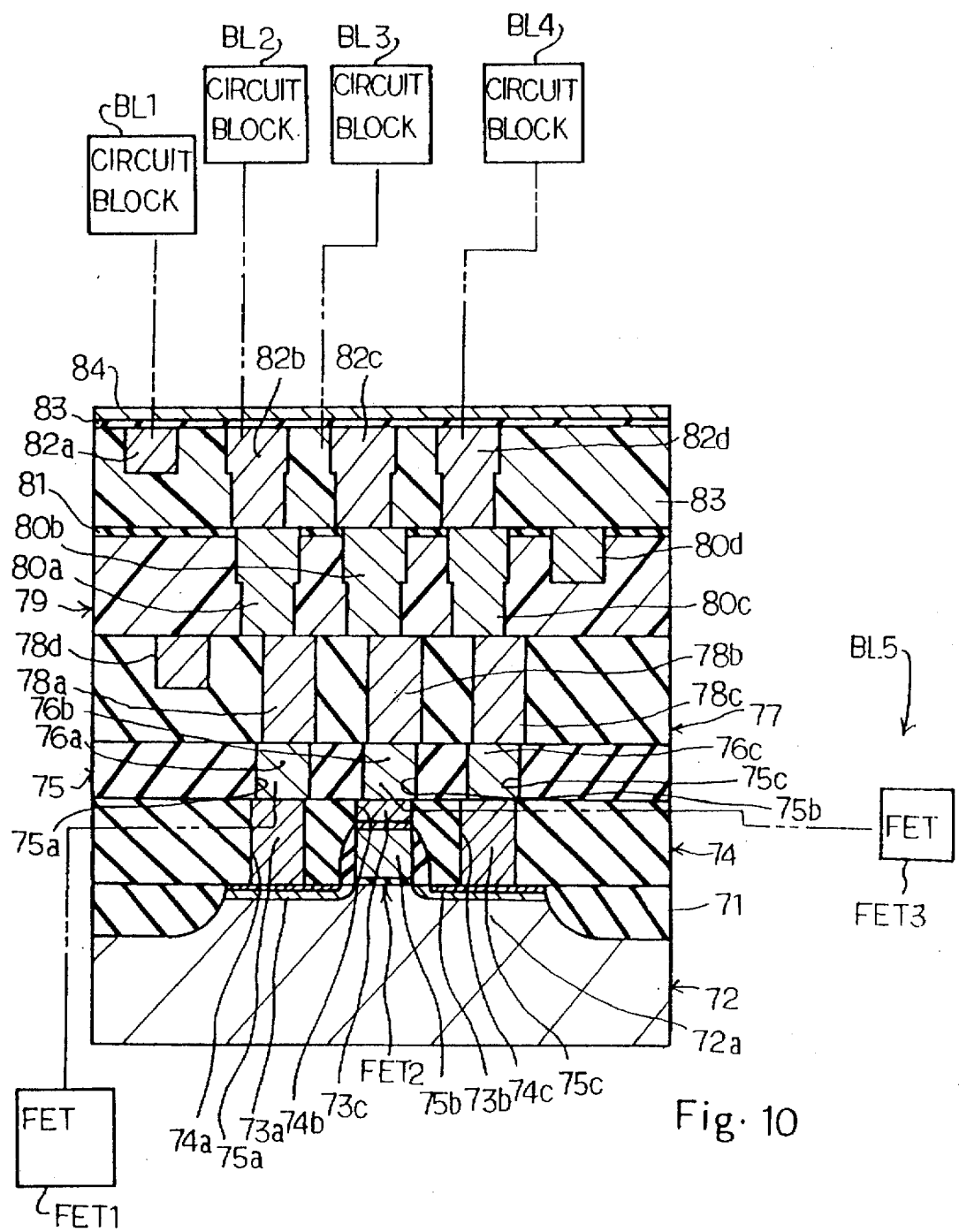
FIG. 10 is a cross sectional view showing the structure of a semiconductor integrated circuit device according to the present invention.

FIG. 10 illustrates a semiconductor integrated circuit device embodying the present invention. Though not shown in the drawings, a plurality of circuit blocks BL1, BL2, BL3, BL4 and BL5 are incorporated in the semiconductor integrated circuit device, and circuit components such as field effect transistors FET1, FET2 and FET3 form each of the circuit blocks such as the circuit block BL5. Local wirings connect the circuit components so as to form the circuit blocks, and global wirings interconnect the circuit blocks. Extremely narrow areas are respectively assigned to the circuit components, and the local wirings are arranged at small pitch. For this reason, the arrangement at smaller pitch is prioritized at the most important position. On the other hand, a large number of circuit blocks enlarges the semiconductor chip, and the large semiconductor chip prolongs the global wirings. Signals are propagated through the prolonged global wirings, and large time constant delays the signals. For this reason, reduction of time constant is the most important technical goal for the global wirings.

The semiconductor integrated circuit device implementing the fourth embodiment includes a multi-level wiring structure, and the local wirings and the global wirings are assigned a lower level and an upper level, respectively. The local wirings and the global wirings are respectively buried in silicon oxide layers and benzocyclobutene layers.

The semiconductor integrated circuit device is fabricated as follows. First, an isolating insulator region 71 is embedded in a moat formed in a semiconductor substrate 72. The moat is 3000 angstroms to 5000 angstroms in depth, and silicon oxide is deposited over the entire surface of the structure by using a low-pressure chemical vapor deposition. The silicon oxide fills the moat, and swells into a silicon oxide layer. The silicon oxide layer is chemically mechanically polished by using neutral silica slurry until the semiconductor substrate 72 is exposed again. The upper surface of the isolating insulator region 71 is coplanar with the major surface of the semiconductor substrate 72. The isolating insulator region 71 defines active areas for the circuit components, and one 72a of the active areas is assigned to a field effect transistor FET2.

Subsequently, the field effect transistor FET2 is fabricated on the active area 72a, and has a salicide structure. Silicon oxide or silicon nitride is deposited to 500 angstroms thick over the entire surface of the structure, and the field effect transistor FET2 is covered with a silicon oxide layer or a silicon nitride layer (not shown).

Boro-phospho-silicate glass is further deposited to 5000 angstroms thick over the silicon oxide/silicon nitride layer, and the silicon oxide/silicon nitride layer is overlain by a boro-phospho-silicate glass layer 74. The boro-phospho-silicate glass layer 74 is reflowed and annealed in nitrogen atmosphere at 800 degrees to 900 degrees in centigrade. The boro-phospho-silicate glass layer 74 is chemically mechanically polished by using silica slurry, and the chemical mechanical polishing creates a flat surface of the boro-phospho-silicate glass layer 74.

Subsequently, contact holes 74a, 74b and 74c are formed in the boro-phospho-silicate glass layer 74 by using a lithographic techniques followed by an etching. The source and drain regions 73a and 73b of the field effect transistor 73 are exposed to the contact holes 74a and 74c, and the contact hole 74b is open to the upper surface of the gate electrode 73c of the field effect transistor 73.

Titanium and titanium nitride are deposited to 100 angstroms thick and 500 angstroms thick over the entire surface of the structure by using a collimate sputtering, and the titanium layer and the titanium nitride layer form a barrier layer (not shown). The barrier layer covers the inner surfaces of the contact holes 74a to 74c, and tungsten is deposited over the barrier layer by using a chemical vapor deposition. The tungsten fills the secondary contact holes defined by the barrier layer in the contact holes 74a to 74c, and swells into a tungsten layer. The tungsten layer is chemically mechanically polished by using silica slurry at pH9 until the boro-phospho-silicate glass layer 74 is exposed again. As a result, tungsten plugs 75a, 75b and 75c are left in the secondary contact holes, and are electrically connected to the source region 73a, the gate electrode 73c and the drain region 73b, respectively.

Subsequently, the local wirings are formed over the boro-phospho-silicate glass layer 74. First, silicon oxide is deposited to 5000 angstroms thick over the boro-phosphosilicate glass layer 74 by using a chemical vapor deposition, and the boro-phospho-silicate glass layer 74 is overlain by a first silicon oxide layer 75. First wiring grooves 75a, 75b and 75c are formed in the first silicon oxide layer 75, and titanium nitride is deposited to 500 angstroms thick over the entire surface of the structure by using the collimate sputtering. The titanium nitride layer (not shown) topographically extends, and defines secondary wiring grooves in the wiring grooves 75a to 75c, respectively. Aluminum is grown to 8000 angstroms thick over the titanium nitride layer by using a high-temperature sputtering. The aluminum fills the secondary wiring grooves, and swells into an aluminum layer. A chemical mechanical polishing removes the aluminum layer and the titanium nitride layer until the first silicon oxide layer 75 is exposed again, and silica slurry is used in the chemical mechanical polishing. Then, first lower wirings 76a, 76b and 76c are formed in the secondary grooves.

Subsequently, silicon oxide is deposited to 10000 angstroms thick over the entire surface of the structure, and a second silicon oxide layer 77 is laminated on the first silicon oxide layer 75. Through-holes and a second wiring groove are formed in the second silicon oxide layer 77, and titanium nitride is deposited to 500 angstroms thick. A titanium nitride layer topographically extends, and defines secondary through-holes and a secondary wiring groove in the through-holes and the wiring groove formed in the second silicon oxide layer 77.

Aluminum is grown by using the high-temperature sputtering. The aluminum fills the secondary through-holes and the secondary wiring groove, and swells into an aluminum layer. The aluminum layer is chemically mechanically polished until the second silicon oxide is exposed again. As a result, vertical interconnections 78a, 78b and 78c and a second lower wiring 78d are left in the secondary through-holes and the secondary wiring groove. The first and second wirings 75a to 75c and 78d form a lower wiring structure. The first lower wirings 76a to 76c are connected through the interconnections 75a to 75c to the source region 73a, the gate electrode 73c and the drain 73b, and the vertical interconnections 78a to 78c are held in contact with the first lower wirings 76a to 76c, respectively.

Finally, the global wirings are formed over the second silicon oxide layer 77 as follows. Benzocyclobutene is spread over the second silicon oxide layer 77, and a benzocyclobutene layer 79 is laminated on the second silicon oxide layer 77.

A low-sensitive photo-resist layer is formed on the benzocyclobutene layer 79, and a first pattern for through-holes is optically transferred to the low-sensitive photo-resist layer so as to form a first latent image. A high-sensitive photo-resist layer is formed on the low-sensitive photo-resist layer, and a second pattern for wiring grooves is optically transferred to the high-sensitive photo-resist layer so as to form a second latent image. The first and second latent images are concurrently developed, and a composite photo-resist etching mask is formed on the benzocyclobutene layer 79. The pattern for the through-holes and the pattern for the wiring grooves are transferred to the benzocyclobutene layer 79 by using the dry etching, and the through-holes and wiring grooves are formed in the benzocyclobutene layer 79. The composite photo-resist etching mask is removed during the pattern transfer to the benzocyclobutene layer 79.

Copper is deposited by using the chemical vapor deposition. The copper fills the through-holes and the wring grooves, and swells into a copper layer. The copper layer is chemically mechanically polished, and interconnections and first upper wirings 80a, 80b, 80c and 80d are formed in the through-holes and the wiring grooves.

Silicon nitride is deposited to 1000 angstroms thick over the benzocyclobutene layer 79, and a silicon nitride layer 81 is laminated on the benzocyclobutene layer 79. The formation of benzocyclobutene layer, the pattern transfer from composite photo-resist etching mask and the formation of copper interconnections and copper wirings are repeated so as to form second upper wirings and interconnections 82a, 82b, 82c and 82d in a benzocyclobutene layer 83. The silicon nitride layer 81 is not always needed.

A silicon nitride layer 83 is deposited over the benzocyclobutene layer 83, and is overlain by a silicon oxide layer 84. The silicon nitride layer 83 and the silicon oxide layer 84 form in combination a passivation layer, and the passivation layer prevents the copper wirings 82a to 82d from undesirable oxidation.

The lower wirings are formed in the silicon oxide layers 74 and 75, and are arranged at extremely small pitch. On the other hand, the upper wirings are formed of low-resistive copper, and the inter-level insulating layers 79 and 83 are formed of benzocyclobutene. For this reason, parasitic capacitance coupled to each upper wiring is so small that a signal is propagated at high speed.

Although particular embodiments of the present invention have been shown and described, it will be obvious to those skilled in the art that various changes and modifications may be made without departing from the spirit and scope of the present invention.

For example, two kinds of negative photo-resist may be used in the process sequence shown in FIGS. 8A to 8H.

The difference in photo-sensitivity may be applied between a lower photo-resist layer and an upper photo-resist layer by selectively volatiling photo-sensitizer. In detail, if the photo-sensitizer is volatized from a lower photo-resist layer, the lower photo-resist layer is decreased in photo-sensitivity. On the other hand, an upper photo-resist layer is laminated on the lower photo-resist layer without volatization of photo-sensitizer after the pattern transfer to the lower photo-resist layer. A pattern transfer to the upper photo-resist layer does not affect the lower photo-resist layer.

In the second embodiment, the copper layer is directly deposited on the inter-level organic insulating layer 55. However, a barrier layer of titanium nitride of 100 angstroms to 300 angstroms thick may be inserted between the inter-level organic insulating layer 55 and the copper layer 58, and prevents the lower aluminum wirings from undesirable reaction with the copper.

What is claimed is:

1. A semiconductor integrated circuit device comprising: at least one circuit component; and
   a multi-level wiring structure coupled to said at least one circuit component for forming an integrated circuit, and including
   at least one lower wiring,
   a lower inter-level insulating layer formed of first photo-sensitive organic material and over said at least lower wiring and having a hole, said at least one lower wiring being exposed to said hole,
   an upper inter-level insulating layer formed of second photo-sensitive organic material higher in photo-sensitivity than said first photo-sensitive organic material and having a plurality of grooves, one of said plurality of grooves being connected to said hole,
   an interconnection formed in said hole and held in contact with said at least one lower wiring, and
   a plurality of upper wirings formed in said plurality of grooves, an upper wiring formed in said one of said plurality of grooves being held in contact with said interconnection.

2. The semiconductor integrated circuit device as set forth in claim 1, further comprising an inorganic inter-level insulating layer beneath said lower inter-level insulating layer, and said at least one lower wiring is embedded in said inorganic inter-level insulating layer in such a manner as to have an upper surface substantially coplanar with an upper surface of said lower inter-level insulating layer.

3. The semiconductor integrated circuit device as set forth in claim 2, in which said inorganic inter-level insulating layer is formed of silicon oxide, and said lower inter-level insulating layer and said upper inter-level insulating layer are formed of low-sensitive polyimide and high-sensitive polyimide, respectively.

4. The semiconductor integrated circuit device as set forth in claim 2, in which said lower inter-level insulating layer is formed on said upper surface of said at least one lower wiring and said upper surface of said inorganic inter-level insulating layer, and has a flat surface where said upper inter-level insulating layer is formed.

5. The semiconductor integrated circuit device as set forth in claim 1, in which said at least one lower wiring is connected between circuit components of a circuit block, and said plurality of upper wirings are connected between said circuit block and other circuit blocks.

6. A semiconductor integrated circuit device comprising:
a plurality of circuit blocks each having a plurality of circuit components; and
a multi-level wiring structure coupled to said at least one circuit component for forming an integrated circuit, and including
at least one lower wiring embedded in an inorganic inter-level insulating layer for interconnecting two of said plurality of circuit components of one of said plurality of circuit blocks and form a flat upper surface together with said inorganic inter-level insulating layer,
an organic inter-level insulating layer formed on said inorganic inter-level insulating layer and having a groove open to an upper surface thereof and a through-hole open at a lower end thereof to said at least one lower wiring and at an upper end thereof to said groove,
an interconnection formed in said through-hole and held in contact with said at least one lower wiring, and
at least one upper wiring formed in said groove and held in contact with said interconnection for interconnecting said one of said plurality of circuit blocks and another of said plurality of circuit blocks.

7. The semiconductor integrated circuit device as set forth in claim 6, in which said organic inter-level insulating layer and said at least one upper wiring are formed of benzocyclobutene and copper, respectively.

8. The semiconductor integrated circuit device as set forth in claim 7, in which said multi-level wiring structure further includes an inorganic insulating layer where said at least one lower wiring is embedded, and said interconnection passes a hole formed in said inorganic insulating layer so as to be held in contact with said at least one lower wiring.

* * * * *